(12) United States Patent
Suyama et al.

(10) Patent No.: US 12,307,931 B2
(45) Date of Patent: May 20, 2025

(54) DISPLAY DEVICE AND METHOD FOR DRIVING DISPLAY DEVICE

(71) Applicant: SHARP KABUSHIKI KAISHA, Sakai (JP)

(72) Inventors: Tatsuhiko Suyama, Sakai (JP); Kazuo Nakamura, Sakai (JP); Noriyuki Tanaka, Sakai (JP); Kazuki Takahashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/269,944

(22) PCT Filed: Dec. 29, 2020

(86) PCT No.: PCT/JP2020/049274
§ 371 (c)(1),
(2) Date: Jun. 27, 2023

(87) PCT Pub. No.: WO2022/145023
PCT Pub. Date: Jul. 7, 2022

(65) Prior Publication Data
US 2024/0321155 A1  Sep. 26, 2024

(51) Int. Cl.
| G09G 3/00 | (2006.01) |
| G09G 3/20 | (2006.01) |
| G09G 3/32 | (2016.01) |
| H10K 59/35 | (2023.01) |

(52) U.S. Cl.
CPC ........... *G09G 3/006* (2013.01); *G09G 3/2074* (2013.01); *G09G 3/32* (2013.01); *H10K 59/353* (2023.02); *G09G 2300/0452* (2013.01); *G09G 2320/0233* (2013.01); *G09G 2320/045* (2013.01); *G09G 2330/12* (2013.01)

(58) Field of Classification Search
CPC ........ G09G 3/006; G09G 3/2074; G09G 3/32; G09G 2300/0452; G09G 2320/0233; G09G 2320/045; G09G 2330/12; H10K 59/353
See application file for complete search history.

(56) References Cited

U.S. PATENT DOCUMENTS

| 11,217,142 B1 * | 1/2022 | Buckley | G06T 5/10 |
| 11,468,851 B2 * | 10/2022 | Nam | G09G 3/3291 |
| 11,663,966 B2 * | 5/2023 | In | G09G 3/3225 345/207 |
| 11,869,435 B2 * | 1/2024 | Yamanaka | G09G 3/3233 |
| 11,908,361 B2 * | 2/2024 | Furukawa | G09G 3/3233 |

(Continued)

FOREIGN PATENT DOCUMENTS

JP  2003-177714 A  6/2003

*Primary Examiner* — Vinh T Lam
(74) *Attorney, Agent, or Firm* — ScienBiziP, P.C.

(57) ABSTRACT

A display device includes a display panel including: a first subpixel including a first light-emitting element; and a second subpixel adjacent to the first subpixel and including a second light-emitting element. The display device includes a circuit unit calculating a degradation amount of the first light-emitting element in accordance with a light-emission state of the second light-emitting element, and calculating a compensation value of the first light-emitting element in accordance with the calculated degradation amount of the first light-emitting element.

18 Claims, 13 Drawing Sheets

(56) References Cited

U.S. PATENT DOCUMENTS

| | | |
|---|---|---|
| 2003/0071804 A1 | 4/2003 | Yamazaki et al. |
| 2006/0103684 A1 | 5/2006 | Yamazaki et al. |
| 2011/0169802 A1* | 7/2011 | Yamashita ............ G09G 3/3291 |
| | | 345/211 |
| 2016/0133193 A1 | 5/2016 | Lee et al. |
| 2016/0140895 A1 | 5/2016 | Park et al. |
| 2020/0160785 A1* | 5/2020 | Park ..................... G09G 3/3233 |
| 2021/0150990 A1* | 5/2021 | Byun .................... G09G 3/3258 |

* cited by examiner

FIG. 2
(a)
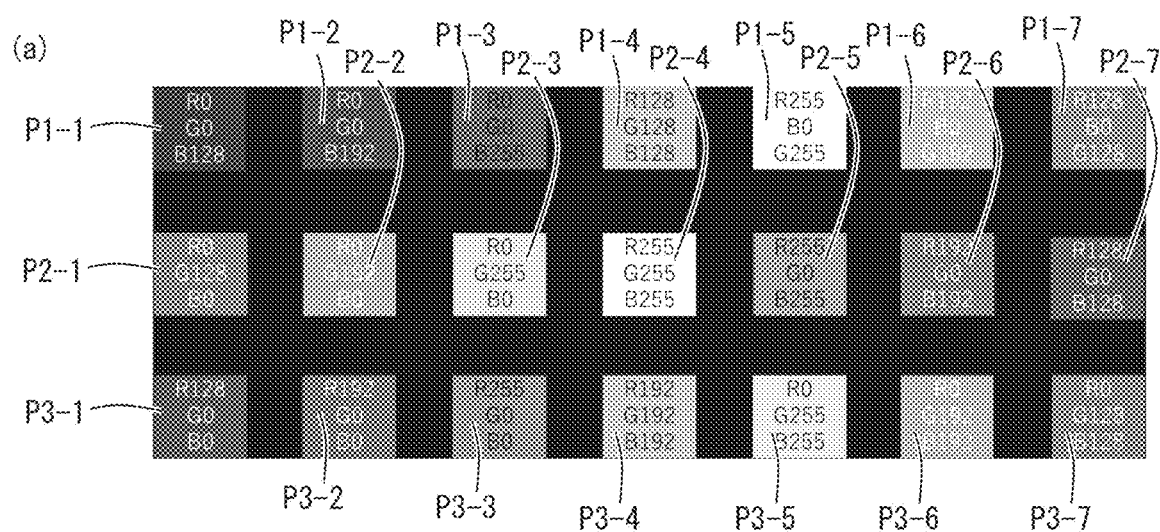
(b)
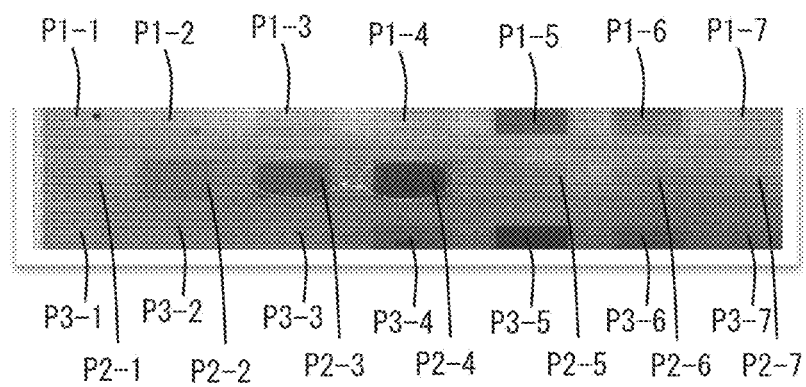

FIG. 8
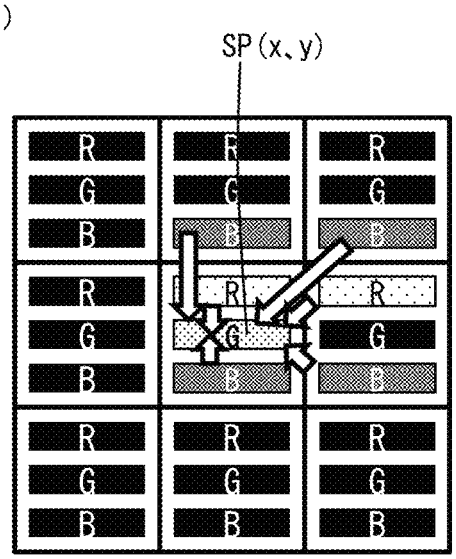
(a)
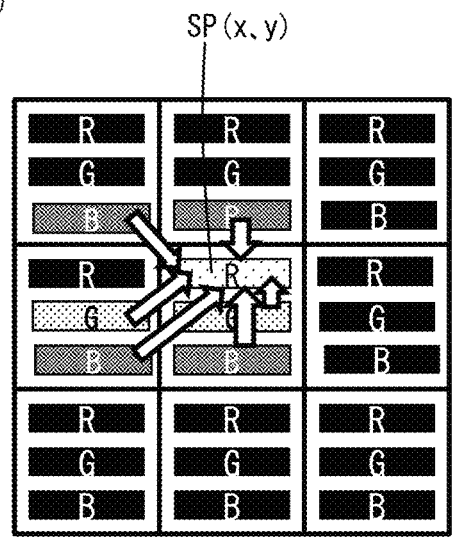
(b)
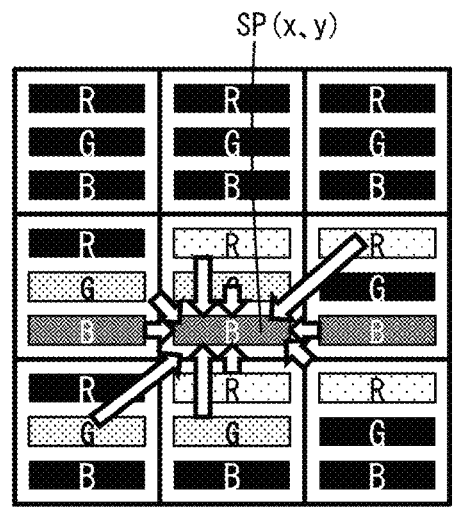
(c)

DISPLAY DEVICE AND METHOD FOR DRIVING DISPLAY DEVICE

TECHNICAL FIELD

The present disclosure relates to a display device and a method for driving the display device.

BACKGROUND ART

In recent years, various display devices including light-emitting elements have been under development. In particular, display devices including organic light-emitting diodes (OLEDs) or quantum-dot light-emitting diodes (QLEDs) are significantly attracting attention because such display devices operate on lower power, have a thinner profile, and achieve higher image quality.

However, luminance of these light-emitting elements is known to change temporally. Specifically, the luminance is known to decrease because the light-emitting elements deteriorate as their operating time increases.

Patent Document 1 describes a technique to compensate for a temporal change in luminance of a light-emitting element.

CITATION LIST

Patent Literature

[Patent Document 1] Japanese Unexamined Patent Application Publication No. 2003-177714

SUMMARY

Technical Problem

However, the technique disclosed in Patent Document 1 to compensate for the temporal change in luminance of a light-emitting element is a technique to obtain a degradation amount of, and a compensation value of, the light-emitting element from data of the temporal change in the luminance of the light-emitting element itself to be compensated.

FIG. 15 illustrates a problem of a related art described in Patent Document 1.

FIG. 15 shows four pixels P1, P2, P3, and P4 each including: a red subpixel RSP including a red light-emitting element (not shown), a green subpixel GSP including a green light-emitting element (not shown), and a blue subpixel BSP including a blue light-emitting element (not shown). The pixel P1 displays a grayscale level 255 for red (an R255-level grayscale). In this case, the red light-emitting element included in the red subpixel RSP emits light whose luminance corresponds to a grayscale level 255, and neither the green light-emitting element included in the green subpixel GSP nor the blue light-emitting element included in the blue subpixel BSP emits light. The pixel P2 displays a grayscale level 255 for yellow (a Y255-level gray scale). In this case, the red light-emitting element included in the red subpixel RSP emits light whose luminance corresponds to a grayscale level 255, and the green light-emitting element included in the green subpixel GSP emits light whose luminance corresponds to a grayscale level 255. The blue light-emitting element included in the blue subpixel BSP does not emit light. The pixel P3 displays a grayscale level 255 for magenta (a M255-level gray scale). In this case, the red light-emitting element included in the red subpixel RSP emits light whose luminance corresponds to a grayscale level 255, and the blue light-emitting element included in the blue subpixel BSP also emits light whose luminance corresponds to a grayscale level 255. The green light-emitting element included in the green subpixel GSP does not emit light. The pixel P4 displays a grayscale level 255 for white (a W255-level gray scale). In this case, the red light-emitting element included in the red subpixel RSP emits light whose luminance corresponds to a grayscale level 255, the green light-emitting element included in the green subpixel GSP also emits light whose luminance corresponds to a grayscale level 255, and the blue light-emitting element included in the blue subpixel BSP also emits light whose luminance corresponds to a grayscale level 255.

The inventors of the disclosure pay attention to the fact that, when each of the pixel P1, the pixel P2, the pixel P3, and the pixel P4 is kept ON in the display state described above (also referred to as burned) for a certain long time period, the degradation amounts of the red light-emitting element included in the red subpixel RSP in the pixel P1, the red light-emitting element included in the red subpixel RSP in the pixel P2, the red light-emitting element included in the red subpixel RSP included in the pixel P3, and the red light-emitting element contained in the red subpixel RSP in the pixel P4 are not comparable with, but different from, one another. Here, for the certain long time period, the red light-emitting elements emit light whose luminance corresponds to a 255-level gray scale.

As described above, a degradation amount of a light-emitting element included in a specific subpixel depends on a light-emission state of a light-emitting element included in a subpixel adjacent to the specific subpixel. Hence, the technique to compensate for the temporal change in the luminance of the light-emitting element disclosed in Patent Document 1 does not to factor in the light-emission state of the light-emitting element included in the adjacent subpixel when obtaining the degradation amount of, and the compensation value of, the light-emitting element from the data of the temporal change in the luminance of the light-emitting element itself to be compensated. A problem of the technique is that the technique utterly fails to factor in the fact that a light-emission state of the light-emitting element, included in the adjacent subpixel, influences on the degradation amount of the light-emitting element to be compensated.

An aspect of the present disclosure is conceived in view of the above problem, and set out to provide a display device capable of compensating for a degradation amount of a light-emitting element, factoring in influence of a light-emission state of a light-emitting element included in an adjacent subpixel. The aspect also provides a method for driving the display device.

Solution to Problem

In order to solve the above problem, a display device according to the present disclosure includes
a display panel including: a first subpixel including a first light-emitting element; and a second subpixel adjacent to the first subpixel and including a second light-emitting element. The display device includes
a circuit unit that calculates a degradation amount of the first light-emitting element in accordance with a light-emission state of the second light-emitting element, and that calculates a compensation value of the first light-emitting element in accordance with the calculated degradation amount of the first light-emitting element.

In order to solve the above problem, a method for driving a display device according to the present disclosure is directed to such a display device including
a display panel including: a first subpixel including a first light-emitting element; and a second subpixel adjacent to the first subpixel and including a second light-emitting element. The method includes:
calculating a degradation amount of the first light-emitting element in accordance with a light-emission state of the second light-emitting element; and calculating a compensation value of the first light-emitting element in accordance with the calculated degradation amount of the first light-emitting element.

Advantageous Effect of Disclosure

An aspect of the present disclosure can provide a display device capable of compensating for a degradation amount of a light-emitting element, factoring in influence of a light-emission state of a light-emitting element included in an adjacent subpixel. The aspect can also provide a method for driving the display device.

BRIEF DESCRIPTION OF DRAWINGS

FIG. 2(a) illustrates a display pattern to be displayed on a display panel of a display device of a comparative example, and FIG. 2(b) illustrates degradation degrees of light-emitting elements in the display pattern illustrated in FIG. 2(a).

FIG. 8(a) illustrates a method for calculating a degradation amount of a light-emitting element included in a green subpixel of the display panel included in the display device of the third embodiment, FIG. 8(b) illustrates a method for calculating a degradation amount of a light-emitting element included in a red subpixel of the display panel included in the display device of the third embodiment, and FIG. 8(c) illustrates a method for calculating a degradation amount of a light-emitting element included in a blue subpixel of the display panel included in the display device of the third embodiment.

DESCRIPTION OF EMBODIMENTS

Described below are embodiments of the disclosure, with reference to FIGS. 1 to 14. For convenience in description, like reference signs designate identical constituent features throughout the embodiments. These constituent features will not be elaborated upon.

First Embodiment

Figure 15:
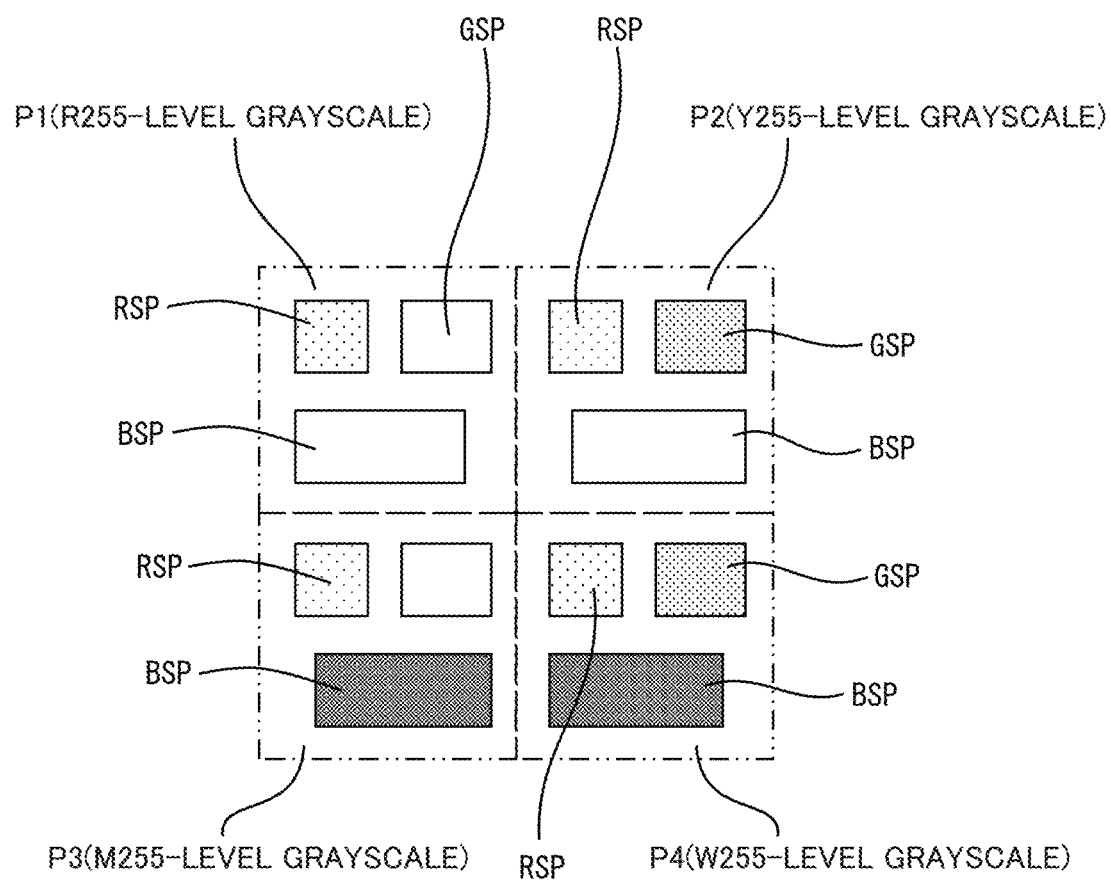
FIG. 15 illustrates a problem of a related art described in Patent Document 1.

FIG. 2(a) illustrates a display pattern (a burned pattern) to be displayed on a display panel of a display device of a comparative example. FIG. 2(b) illustrates degradation degrees of light-emitting elements in the display pattern illustrated in FIG. 2(a). Note that pixels P1-1 to P1-7, P2-1 to P2-7, and P3-1 to P3-7 of the display panel illustrated in FIG. 2(a) and FIG. 2(b) have the same structure as the structure of the pixels P1 to P4 illustrated in FIG. 15. In each of the pixels, a blue subpixel BSP is larger in size than a green subpixel GSP and a red subpixel RSP, and the green subpixel GSP is larger than in size than the red subpixel RSP.

Each of the pixels P1-1 to P1-7, P2-1 to P2-7, and P3-1 to P3-7 of the display panel illustrated in FIG. 2(a) is burned for 250 hours in a predetermined display pattern illustrated in FIG. 2(a). After that, as illustrated in FIG. 2(b), each of the pixels P1-1 to P1-7, P2-1 to P2-7, and P3-1 to P3-7 is displayed in a grayscale level 255 for green, and a display state of each pixel is measured so that a degradation degree is estimated of a green light-emitting element included in a green subpixel of each of the pixels in the display pattern illustrated in FIG. 2(a). Note that when the display state is observed, noise correction, or difference enhancement, of measured numerical values may be performed as appropriate.

As illustrated in FIG. 2(a), the pixel P2-3 is burned for 250 hours in a display pattern of a grayscale level 255 for green (R0, G255, B0). The pixel P2-4 is burned for 250 hours in a display pattern of a grayscale level 255 for red, a grayscale level 255 for green, and a grayscale level 255 for blue (R255, G255, B255). After that, as illustrated in FIG. 2(b), the pixel P2-3 and the pixel P2-4 are displayed in a grayscale level 255 for green (R0, G255, B0), and display states of the two pixels are observed. Through the observation, a comparison can be made between a degradation degree of a green light-emitting element included in a green subpixel of the pixel P2-3 and a degradation degree of a green light-emitting element included in a green subpixel of the pixel P2-4.

As illustrated in FIG. 2(b), the pixel P2-4 is displayed less brightly than the pixel P2-3. This means that, when the pixel P2-4 is burned for 250 hours in the display pattern of the grayscale level 255 for red, the grayscale level 255 for green, and the grayscale level 255 for blue (R255, G255, B255), the degradation degree of the green light-emitting element included in the green subpixel of the pixel P2-4 is greater than the degradation degree of the green light-emitting element included in the green subpixel of the pixel P2-3 burned for 250 hours in the display pattern of the grayscale level 255 for green (R0, G255, B0).

As described above, in both the pixel P2-3 and the pixel P2-4, the green light-emitting elements included in the respective green subpixels glow for 250 hours under the same condition; that is, the grayscale level 255. However, the degradation degree of the green light-emitting elements varies, depending on a glowing state of a light-emitting element included in an adjacent subpixel. As to the pixel P2-3, both a red light-emitting element included in a red subpixel and a blue light-emitting element included in a blue subpixel are OFF in a grayscale level 0. Whereas, as to the pixel P2-4, both a red light-emitting element included in a red subpixel and a blue light-emitting element included in a blue subpixel are ON in a grayscale level 255. Hence, the degradation degree of the green light-emitting element included in the green subpixel of the pixel P2-4 is greater than the degradation degree of the green light-emitting element included in the green subpixel of the pixel P2-3.

The reason for the difference in the degradation degree is probably because the green light-emitting element included in the green subpixel is influenced by, for example, leakage (crosstalk) and heat caused by the glowing red light-emitting element included in the adjacent red subpixel and the glowing blue light-emitting element included in the adjacent blue subpixel.

Hence, the inventors of the disclosure propose a display device capable of compensating for a degradation amount of a light-emitting element with higher precision, while factoring in even a degradation degree observed depending on a glowing state (a light-emission state) of a light-emitting element included in an adjacent subpixel. The inventors also propose a method for driving such a display device.

Figure 1:
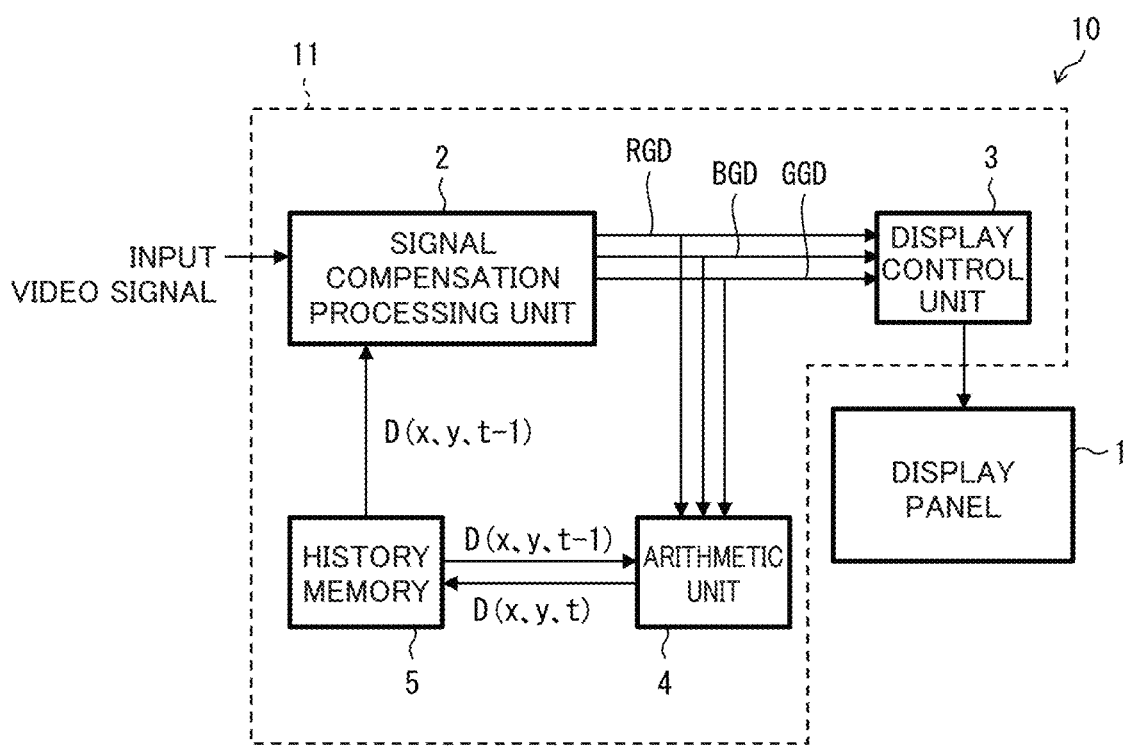
FIG. 1 illustrates a schematic configuration of a display device of a first embodiment.

FIG. 1 illustrates a schematic configuration of a display device 10 of a first embodiment.

As illustrated in FIG. 1, the display device 10 includes: a display panel 1; and a circuit unit 11. In this embodiment, for example, the circuit unit 11 includes, but not limited to, a signal compensation processing unit 2, a display control unit 3, an arithmetic unit 4, and a history memory 5.

The display panel 1 includes a plurality of pixels in a display region. Each of the plurality of pixels includes a plurality of subpixels. Each of the plurality of subpixels includes a light-emitting element. The light-emitting element may be, for example, an OLED or a QLED.

The signal compensation processing unit 2 is a circuit to: calculate a compensation value of a light-emitting element included in a relevant subpixel (a subpixel at the coordinates x, y), in accordance with degradation amounts D (x, y, t−1) and (x, y, t) of the light-emitting element included in the relevant subpixel (the subpixel at the coordinates x, y); executes signal compensation processing on an input video signal in accordance with the compensation value; and outputs the input video signal in a form of video signal data RGD, BGD, and GGD. Note that the degradation amounts D (x, y, t−1) and D (x, y, t) of the light-emitting element included in the relevant subpixel are sent from the history memory 5 to the signal compensation processing unit 2.

Note that a previous degradation amount D (x, y, t−1) means a cumulative degradation amount of the light-emitting element included in the relevant subpixel (the subpixel at the coordinates x, y) from time points 0 to t−1, and a current degradation amount D (x, y, t) means a cumulative degradation amount of the light-emitting element included in the relevant subpixel (the subpixel at the coordinates x, y) from time points 0 to t. The current degradation amount can be obtained when a degradation amount of the light-emitting element included in the relevant subpixel (the subpixel at the coordinates x, y) from time t−1 to t is added to the previous degradation amount D (x, y, t−1).

When the display device 10 is turned from OFF to ON, the previous degradation amount D (x, y, t−1) is sent from the history memory 5 to the signal compensation processing unit 2. The signal compensation processing unit 2: calculates, in accordance with the previous degradation amount D (x, y, t−1), a compensation value of the light-emitting element included in the relevant subpixel (the subpixel at the coordinates x, y); and executes the signal compensation processing on the input video signal in accordance with the compensation value.

Then, the arithmetic unit 4 obtains the current degradation amount D (x, y, t). After that, the current degradation amount D (x, y, t) is sent from the history memory 5 to the signal compensation processing unit 2. The signal compensation processing unit 2 calculates, in accordance with the current degradation amount D (x, y, t), a compensation value of the light-emitting element included in the relevant subpixel (the subpixel at the coordinates x, y), and executes the signal compensation processing on the input video signal in accordance with the compensation value.

The display control unit 3 is a drive circuit that drives a light-emitting element included in each subpixel of the display panel 1, in accordance with the video signal data RGD, BGD, and GGD subjected to the signal compensation processing. The display control unit 3 then displays an image. The video signal data RGD, BGD and GGD includes coordinate data indicating positions of the subpixels and grayscale values. The display control unit 3 may be, for example, either provided on the display panel 1, or externally attached to the display panel 1.

The arithmetic unit 4 calculates the current degradation amount D (x, y, t) of the light-emitting element, included in the relevant subpixel (the subpixel at the coordinates x, y), in accordance with: the previous degradation amount D (x, y, t−1) of the light-emitting element included in the relevant subpixel (the subpixel at the coordinates x, y), the previous degradation amount D (x, y, t−1) being sent from the history memory 5; and a grayscale value or a glowing period of a subpixel adjacent to the relevant subpixel (the subpixel at the coordinates x, y); that is, a light-emission state of the light-emitting element, included in the subpixel adjacent to the relevant subpixel (the subpixel at the coordinates x, y), between the time points t−1 to t. Note that the current degradation amount D (x, y, t) calculated by the arithmetic unit 4 is sent to the signal compensation processing unit 2 through the history memory 5. The signal compensation processing unit 2: calculates, in accordance with the current degradation amount D (x, y, t), the compensation value of the light-emitting element included in the relevant subpixel (the subpixel at the x, y coordinates); performs the signal compensation processing on the input video signal in accordance with the compensation value; and outputs the input video signal as the video signal data RGD, BGD, and GGD.

This embodiment exemplifies a case where the arithmetic unit 4 calculates the degradation amount D (x, y, t) and the signal compensation processing unit 2 calculates the compensation value. However, this embodiment shall not be limited to such a case. For example, the arithmetic unit 4 may calculate both the degradation amount D (x, y, t) and the compensation value. In this case, the arithmetic unit 4 sends the compensation value to the signal compensation processing unit 2.

Note that the data indicating the light-emission state of the light-emitting element included in the subpixel adjacent to the relevant subpixel (the subpixel at the coordinates x, y) of the display panel 1 can be obtained when, for example, a counter counts a glowing period of the adjacent subpixel or the number of grayscale values of the video signal data RGD, BGD, and GGD subjected to the signal compensation and supplied from the signal compensation processing unit 2 to the arithmetic unit 4.

The history memory 5 is preferably a nonvolatile memory. If the nonvolatile memory has a restriction on the number of writes, the data may be stored on a volatile memory while the display device 10 is under operation, and on the nonvolatile memory at regular time intervals.

Figure 3:
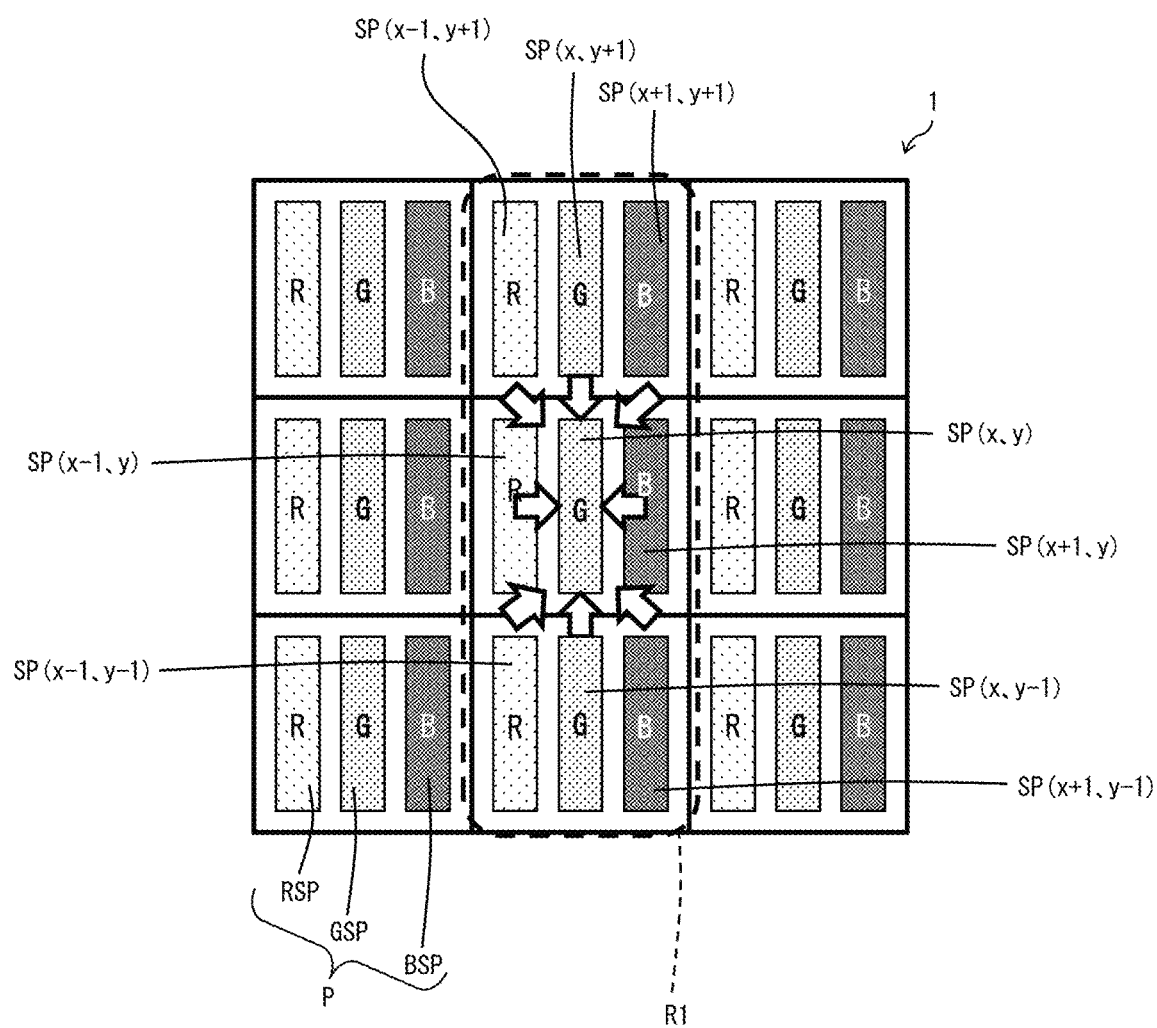
FIG. 3 illustrates a schematic configuration of a pixel of the display panel included in the display device of the first embodiment.
Figure 4:
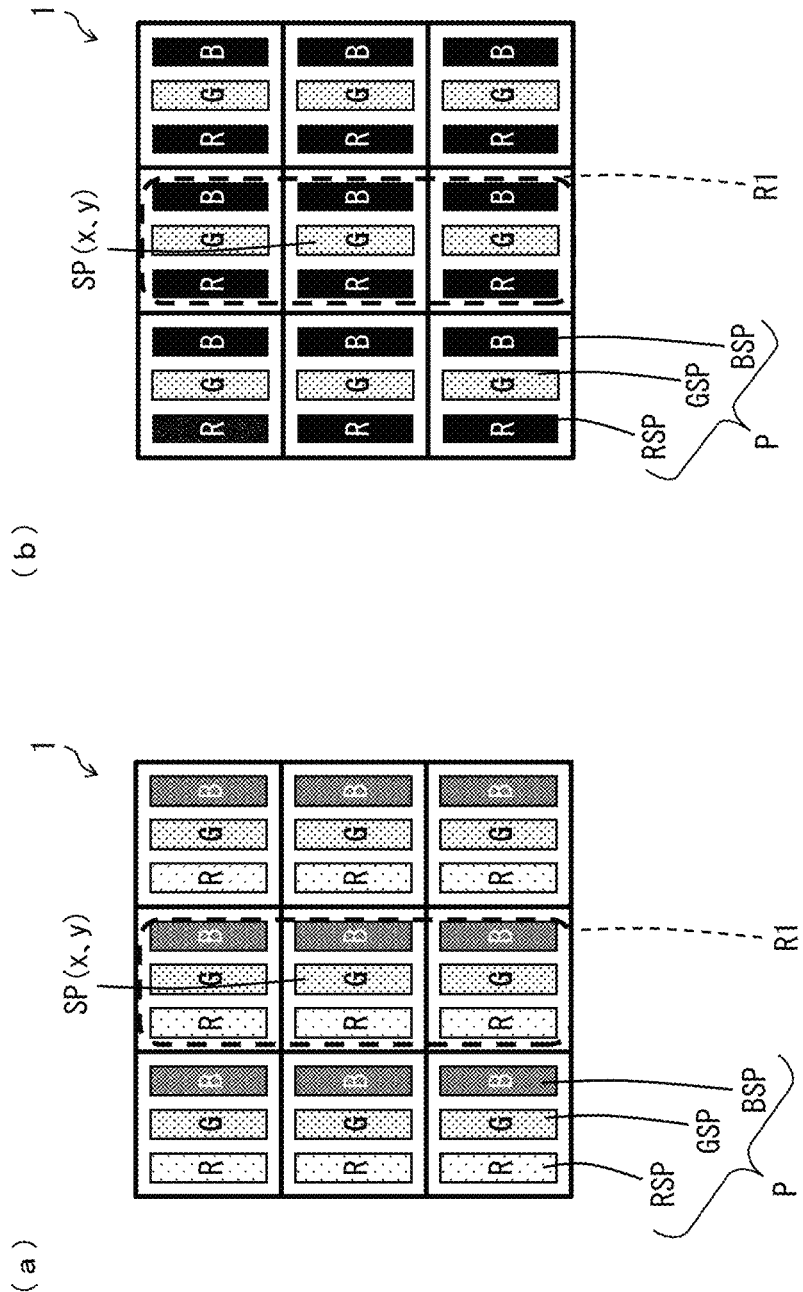
FIG. 4(a) illustrates a case where each pixel of the display panel included in the display device of the first embodiment displays a display pattern of a grayscale level 255 for white.
FIG. 4(b) illustrates a case where each pixel of the display panel included in the display device of the first embodiment displays a display pattern of a grayscale level 255 for green.

FIG. 3 illustrates a schematic configuration of a pixel P of the display panel 1 included in the display device 10 of the first embodiment.

As illustrated in FIG. 3, each pixel P of the display panel 1 includes: a red subpixel RSP; a green subpixel GSP; and a blue subpixel BSP. Note that this embodiment exemplifies a case where the red subpixel RSP, the green subpixel GSP, and the blue subpixel BSP are the same in shape and size. However, this embodiment shall not be limited to such a case.

Each red subpixel RSP includes a not-shown red light-emitting element, each green subpixel GSP includes a not-shown green light-emitting element, and each blue subpixel BSP includes a not-shown blue light-emitting element.

This embodiment exemplifies a case of calculating: the current degradation amount D (x, y, t) of a light-emitting element included in a first subpixel SP (x, y) in FIG. 3; and the compensation value of the light-emitting element included in the first subpixel SP (x, y) in accordance with the current degradation amount D (x, y, t) of the light-emitting element included in the first subpixel SP (x, y). Besides, the compensation value can be similarly calculated for a light-emitting element included in another subpixel.

As illustrated in FIG. 3, the first subpixel SP (x, y) including a not-shown first light-emitting element is surrounded with eight subpixels including a second subpixel SP (x−1, y) adjacent to the first subpixel SP (x, y) and including a not-shown second light-emitting element. The eight subpixels further include: a third subpixel SP (x−1, y+1) adjacent to the first subpixel SP (x, y) and including a not-shown third light-emitting element; a fourth subpixel SP (x, y+1) adjacent to the first subpixel SP (x, y) and including a not-shown fourth light-emitting element; a fifth subpixel SP (x+1, y+1) adjacent to the first subpixel SP (x, y) and including a not-shown fifth light-emitting element; a sixth subpixel SP (x+1, y) adjacent to the first subpixel SP (x, y) and including a not-shown sixth light-emitting element; a seventh subpixel SP (x+1, y−1) adjacent to the first subpixel SP (x, y) and including a not-shown seventh light-emitting element; an eighth subpixel SP (x, y−1) adjacent to the first subpixel SP (x, y) and including a not-shown eighth light-emitting element; and a ninth subpixel SP (x−1, y−1) adjacent to the first subpixel SP (x, y) and including a not-shown ninth light-emitting element.

A degradation amount of the light-emitting element included in the first subpixel SP (x, y) is calculated in accordance with: a light-emission state of the second light-emitting element; a light-emission state of the third-light emitting element; a light-emission state of the fourth light-emitting element; a light-emission state of the fifth light-emitting element; a light-emission state of the sixth light-emitting element; a light-emission state of the seventh light-emitting element; a light-emission state of the eighth light-emitting element; and a light-emission state of the ninth light-emitting element.

As illustrated in FIG. 3, the first subpixel SP (x, y), the second subpixel SP (x−1, y), the third subpixel SP (x−1, y+1), the fourth subpixel SP (x, y+1), the fifth subpixel SP (x+1, y+1), the sixth subpixel SP (x+1, y), the sixth subpixel SP (x+1, y), the seventh subpixel SP (x+1, y−1), the eighth subpixel SP (x, y−1), and the ninth subpixel SP (x−1, y−1) are arranged in a three-by-three matrix. The first subpixel SP (x, y) is a subpixel disposed in the second row and the second column.

This embodiment exemplifies a case where Equation 1 below is used to calculate the current degradation amount D (x, y, t) of the light-emitting element included in the first subpixel SP (x, y). However, this embodiment shall not be limited to such a case.

[Math. 1]

$$D(x, y, t) = D(x, y, t-1) + \sum_{\substack{\text{for each} \\ i=-1,0,1 \\ j=-1,0,1}} \alpha_{\{i,j\}} \beta_{[F\{G(x+i,y+j)\}]} \, F_{\{G(x,y)\}}. \quad \text{(Equation 1)}$$

In Equation 1 above, x and y represent the coordinates of the first subpixel SP (x, y) including the first light-emitting element, t represents time, D (x, y, t−1) represents a previous degradation amount of the first light-emitting element, F{G (x, y)} represents the degradation amount of the first light-emitting element when the influence of a subpixel adjacent to the first subpixel is not factored in, α{i, j} represents a weighting coefficient based on a positional relationship with the first subpixel SP (x, y), β[F{G (x+i, y+j)}] represents a degradation promotion coefficient indicating a degree of influence, on the first subpixel SP (x, y), derived from a light-emission state of a light-emitting element included in the subpixel adjacent to the first subpixel SP (x, y), and the light-emission state is determined by a grayscale value or a glowing period of the subpixel adjacent to the first subpixel SP (x, y).

Note that if i and j are 0, α{0, 0}β[F{G (x, y)}] is 0 or 1.

The coefficient α{i, j} is a weighting coefficient based on the positional relationship with the first subpixel SP (x, y), and determined in accordance with a positional relationship between the first subpixel SP (x, y) and a subpixel adjacent to the first subpixel SP (x, y). For example, if the distance between the first subpixel SP (x, y) and the subpixel adjacent to the first subpixel SP (x, y) is relatively short, α{i, j} can be set large, because the subpixel adjacent to the first subpixel SP (x, y) exerts a large influence on the first subpixel SP (x, y). Meanwhile, if the distance between the first subpixel SP (x, y) and the subpixel adjacent to the first subpixel SP (x, y) is relatively long, α{i, j} can be set small, for example, to approximately 1, because the subpixel adjacent to the first subpixel SP (x, y) does not exert a large influence on the first subpixel SP (x, y). Note that if the influence, of the subpixel adjacent to the first subpixel SP (x, y), on the first subpixel SP (x, y) can be negligible, $\alpha\{i, j\}$ does not have to be used.

This embodiment exemplifies a case where, as described above, the degradation promotion coefficient $\beta[F\{G(x+i, y+j)\}]$ is a degradation promotion coefficient indicating a degree of influence, on the first subpixel SP (x, y), derived from data indicating a light-emission state of a light-emitting element included in a subpixel adjacent to the first subpixel SP (x, y) of the display panel 1. The light-emission state is obtained when, for example, a counter counts the glowing period or the number of the grayscale values of the video signal data RGD, BGD, and GGD subjected to the signal compensation processing and supplied from the signal compensation processing unit 2 to the arithmetic unit 4. However, this embodiment shall not be limited to such a case. For example, the degradation promotion coefficient $\beta[F\{G(x+i, y+j)\}]$ may be a degradation promotion coefficient indicating a degree of influence, on the first subpixel SP (x, y), derived from a degradation amount (a degradation amount obtained when the influence of an adjacent subpixel is not factored in) of a light-emitting element included in a subpixel adjacent to the first subpixel SP (x, y).

According to Equation 1 above, D (x, y, t)=D (x, y, t−1)+$\alpha\{-1, -1\}\beta[F\{G(x-1, y-1)\}]F\{G(x,y)\}+\alpha\{-1, 0\}\beta[F\{G(x-1,y)\}]F\{G(x,y)\}+\alpha\{-1, +1\}\beta[F\{G(x-1, y+1)\}]F\{G(x, y)\}+\alpha\{0, -1\}\beta[F\{G(x, y-1)\}]F\{G(x, y)\}+\alpha\{0, 0\}\beta[F\{G(x, y)\}]F\{G(x, y)\}+\alpha\{0, +1\}\beta[F\{G(x, y+1)\}]F\{G(x, y)\}+\alpha\{+1, -1\}\beta[F\{G(x+1, y-1)\}]F\{G(x, y)\}+\alpha\{+1, 0\}\beta[F\{G(x+1, y)\}]F\{G(x, y)\}+\alpha\{+1, +1\}\beta[F\{G(x+1, y+1)\}]F\{G(x, y)\}$. If i and j are 0, $\alpha\{0, 0\}\beta[F\{G(x, y)\}]$ are 0 or 1. Hence, $\alpha\{0, 0\}\beta[F\{G(x, y)\}]F\{G(x, y)\}$ is 0 or F{G (x, y)}.

In Equation 1 above, if i and j are 0, $\alpha\{0, 0\}\beta[F\{G(x, y)\}]F\{G(x, y)\}$ is a value indicating influence of the light-emission state of the first light-emitting element included in the first subpixel SP (x, y). The influence is exerted on degradation of the first light-emitting element included in the first subpixel SP (x, y) itself. Note that, in this case, the degradation promotion coefficient $\beta[F\{G(x, y)\}]$ is, but not limited to, a degradation promotion coefficient indicating a degree of influence, on the first subpixel SP (x, y), derived from the light-emission state of the first light-emitting element included in the first subpixel SP (x, y). For example, the degradation promotion coefficient $\beta[F\{G(x, y)\}]$ may be a degradation promotion coefficient indicating a degree of influence, on the first subpixel SP (x, y), derived from a degradation amount of the first light-emitting element included in the first subpixel SP (x, y).

Because the weighting coefficient $\alpha\{i, j\}$ the degradation promotion coefficient $\beta[F\{G(x+i, y+j)\}]$, both based on the positional relationship with the first subpixel SP (x, y), vary depending on each product including the display device, these coefficients are variably determined to correspond to various products including the display device.

As described above, the data indicating: the light-emission state of a light-emitting element included in a subpixel adjacent to the first subpixel SP (x, y) of the display panel 1; and the light-emission state of the first light-emitting element included in the first subpixel SP (x, y) can be obtained when, for example, a counter included in the arithmetic unit 4 counts the glowing periods of the subpixels or the number of grayscale values of the video signal data RGD, BGD, and GGD subjected to the signal compensation processing and supplied from the signal compensation processing unit 2 to the arithmetic unit 4 (also referred to as a data counting method).

The data indicating the light-emission state of a relevant light-emitting element may be obtained by a method other than the data counting method described above. For example, the data may be a degradation amount of the relevant light-emitting element. When the influence of a subpixel adjacent to the first subpixel SP (x, y) is not factored in, the degradation amount F{G (x, y)} of the first light-emitting element and the degradation amount F{G (x+i, y+j)} of a light-emitting element included in a subpixel adjacent to the first subpixel SP (x, y) may be obtained in accordance with, for example, the use time of the display device 10. Otherwise, these degradation amounts may be obtained by the data counting method described above.

As illustrated in FIG. 3, this embodiment exemplifies a case where a region R1 is designated as an area of adjacent subpixels that exert influence on the degradation amount of the first light-emitting element included in the first subpixel SP (x, y), and where relationships i=−1, 0, +1 and j=−1, 0, +1 hold in Equation 1. However, this embodiment shall not be limited to such a case. This embodiment allows appropriate setting of the area of the adjacent subpixels that exert influence on the degradation amount of the first light-emitting element included in the first subpixel SP (x, y).

Note that, in this embodiment, the red subpixel RSP, the green subpixel GSP, and the blue subpixel BSP included in each pixel P of the display panel 1 are the same in shape and size. Hence, the value of the weighting coefficient $\alpha\{i, j\}$ based on the positional relationship with the first subpixel SP (x, y) may be constant, regardless of the values of i and j if i and j are not 0. For example, all of $\alpha\{-1, -1\}$, $\alpha\{0, -1\}$, $\alpha\{+1, -1\}$, $\alpha\{-1, 0\}$, $\alpha\{+1, 0\}$, $\alpha\{-1, +1\}$, $\alpha\{0, +1\}$ and $\alpha\{+1, +1\}$ may be set to 1.

FIG. 4(a) illustrates a case where each pixel P of the display panel 1 included in the display device 10 of the first embodiment displays a display pattern of a grayscale level 255 for white. FIG. 4(b) illustrates a case where each pixel P of the display panel 1 included in the display device 10 of the first embodiment displays a display pattern of a grayscale level 255 for green.

In the display panel 1 illustrated in FIG. 4(a), each pixel P displays a display pattern of the grayscale level 255 for white. Hence, all of the light-emitting elements included in the respective eight subpixels surrounding the first subpixel SP (x, y) glow at the grayscale level 255.

On the other hand, in the display panel 1 illustrated in FIG. 4(b), each pixel P displays a display pattern of the grayscale level 255 for green. Hence only two of the light-emitting elements included in the respective eight subpixels surrounding the first subpixel SP (x, y); that is, a light-emitting element included in a subpixel above the first subpixel SP (x, y) and a light-emitting element included in a subpixel below the first subpixel SP (x, y), glow at the grayscale level 255.

Figure 5:
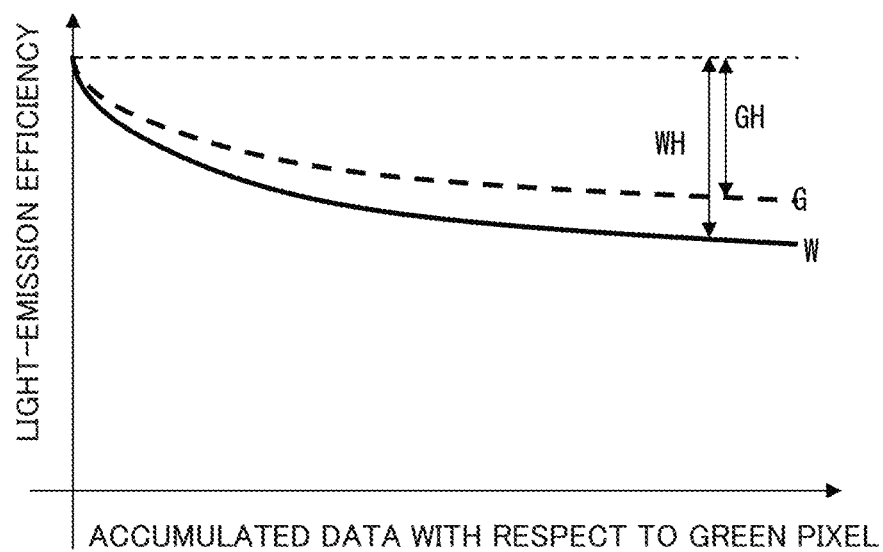
FIG. 5 illustrates compensation carried out on the display device of the first embodiment for degradation of a light-emitting element.

FIG. 5 illustrates compensation carried out on the display device 10 of the first embodiment for degradation of a light-emitting element.

The line W in FIG. 5 represents a degradation amount of the light-emitting element included in the first subpixel SP (x, y) in the display panel 1 illustrated in FIG. 4(a). The line G in FIG. 5 represents a degradation amount of the light-emitting element included in the first subpixel SP (x, y) in the display panel 1 illustrated in FIG. 4(b).

FIG. 5 shows that even if the light-emitting element itself included in the first subpixel SP (x, y) glows at the same grayscale level 255, the degradation amount of the light-emitting element included in the first subpixel SP (x, y) significantly varies depending on the light-emission states of the light-emitting elements included in the respective eight subpixels surrounding the first subpixel SP (x, y).

As described above, the display device 10 of this embodiment, or the method for driving the display device 10, can compensate for the degradation amount of the light-emitting element included in the first subpixel SP (x, y), while factoring in the influence exerted by a light-emission state of a light-emitting element included in a subpixel adjacent to the first subpixel SP (x, y). Furthermore, the display device 10, or the method for driving the display device 10, can obtain with higher precision the degradation amount of the light-emitting element included in the first subpixel SP (x, y). In accordance with the degradation amount obtained with higher precision, as illustrated in FIG. 5, the display device 10, or the method for driving the display device 10, can calculate: a compensation value WH for a degradation amount of the light-emitting element included in the first subpixel SP (x, y) in the display panel 1 illustrated in FIG. 4(a); and a compensation value GH for a degradation amount of the light-emitting element included in the first subpixel SP (x, y) in the display panel 1 illustrated in FIG. 4(b). Such features make it possible to compensate for a degradation amount of a light-emitting element with higher precision.

Second Embodiment

Described next is a second embodiment of the disclosure, with reference to FIG. 6. A display device 10a of this embodiment includes a circuit unit 11a including an arithmetic unit 4a. The arithmetic unit 4a uses an equation different from the equation described in the first embodiment, in order to calculate the current degradation amount D (x, y, t) of the light-emitting element included in the first subpixel SP (x, y). Otherwise, the display device 10a of this embodiment is the same as the display device 10 of the first embodiment. For convenience in description, like reference signs designate identical constituent features throughout the drawings between this embodiment and the first embodiment. These constituent features will not be elaborated upon.

Figure 6:
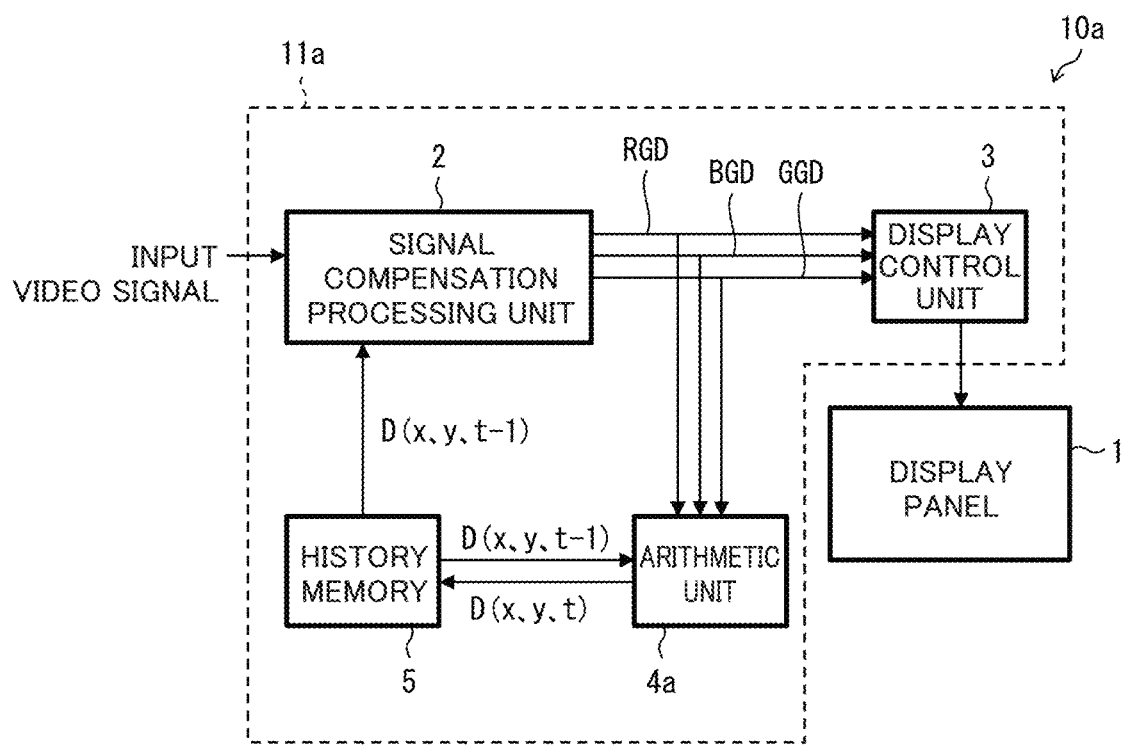
FIG. 6 illustrates a schematic configuration of a display device of a second embodiment.

FIG. 6 illustrates a schematic configuration of the display device 10a of the second embodiment.

As illustrated in FIG. 6, the display device 10a includes the arithmetic unit 4a. The arithmetic unit 4a calculates the current degradation amount D (x, y, t) of the light-emitting element included in the first subpixel SP (x, y) with Equation 2 below:

[Math. 2]

$$D(x, y, t) = D(x, y, t-1) + \sum_{\substack{\text{for each} \\ i=-1,0,1 \\ j=-1,0,1}} \alpha_{\{i,j\}} \beta_{[F\{G(x+i,y+j)\}]}. \quad \text{(Equation 2)}$$

In Equation 2 above, x and y represent the coordinates of the first subpixel SP (x, y) including the first light-emitting element, t represents time, D (x, y, t−1) represents a previous degradation amount of the first light-emitting element, α{i, j} represents a weighting coefficient based on a positional relationship with the first subpixel SP (x, y), β[F{G (x+i, y+j)} ] represents a degradation promotion coefficient indicating a degree of influence, on the first subpixel SP (x, y), derived from a light-emission state of a light-emitting element included in a subpixel adjacent to the first subpixel SP (x, y), and the light-emission state is determined by a grayscale value or a glowing period of the subpixel adjacent to the first subpixel SP (x, y).

Note that if i and j are 0, α{0, 0}β[F{G (x, y)}] is 0 or 1.

The arithmetic unit 4a included in the circuit unit 11a of the display device 10a uses Equation 2 above for calculating the current degradation amount D (x, y, t) of the light-emitting element included in the first subpixel SP (x, y). Equation 2 differs from Equation 1 of the first embodiment in that the degradation amount F{G (x, y)} of the first light-emitting element is 1, when influence is not factored in of a subpixel adjacent to the first subpixel SP (x, y) in Equation 1 of the first embodiment.

According to Equation 2 above, D (x, y, t)=D (x, y, t−1)+α{−1, −1}β[F{G (x−1, y−1)}]+α{−1, 0}β[F{G (x−1, y)}]+α{−1, +1}β[F{G (x−1, y+1)}]+α{0, −1}β[F{G (x, y−1)}]+α{0, 0}β[F{G(x, y)}]+α{0, +1}β[F{G(x, y+1)}]+α{+1, −1}β[F{G (x+1, y−1)}]+α{+1, 0}β[F{G (x+1, y)}]+α{+1, +1}β[F{G(x+1, y+1)}]].

In Equation 2 above, if i and j are 0, α{0, 0}β[F{G (x, y)} ] is a value indicating influence of the light-emission state of the first light-emitting element included in the first subpixel SP (x, y). The influence is exerted on degradation of the first light-emitting element included in the first subpixel SP (x, y) itself.

Note that, in this embodiment, the red subpixel RSP, the green subpixel GSP, and the blue subpixel BSP included in each pixel P of the display panel 1 are the same in shape and size. Hence, a value of the weighting coefficient α{i, j} for a degradation amount of a light-emitting element included in a subpixel adjacent to the subpixel SP (x, y) may be constant, regardless of the values of i and j if i and j are other than 0. For example, all of α{−1, −1}, α{0, −1}, α{+1, −1}, α{−1, 0}, α{+1, 0}, α{−1, +1}, α{0, +1} and α{+1, +1}; may be set to 1.

As described above, the display device 10a of this embodiment, or the method for driving the display device 10a, can compensate for a degradation amount of the light-emitting element included in the first subpixel SP (x, y), while factoring in influence exerted by a light-emission state of a light-emitting element included in a subpixel adjacent to the first subpixel SP (x, y). Furthermore, the display device 10a of this embodiment, or the method for driving the display device 10a, can obtain with higher precision a degradation amount of the light-emitting element included in the first subpixel SP (x, y). In accordance with the degradation amount obtained with higher precision, the display device 10a of this embodiment, or the method for driving the display device 10a, can compensate for a degradation amount of a light-emitting element with higher accuracy.

Third Embodiment

Figure 7:
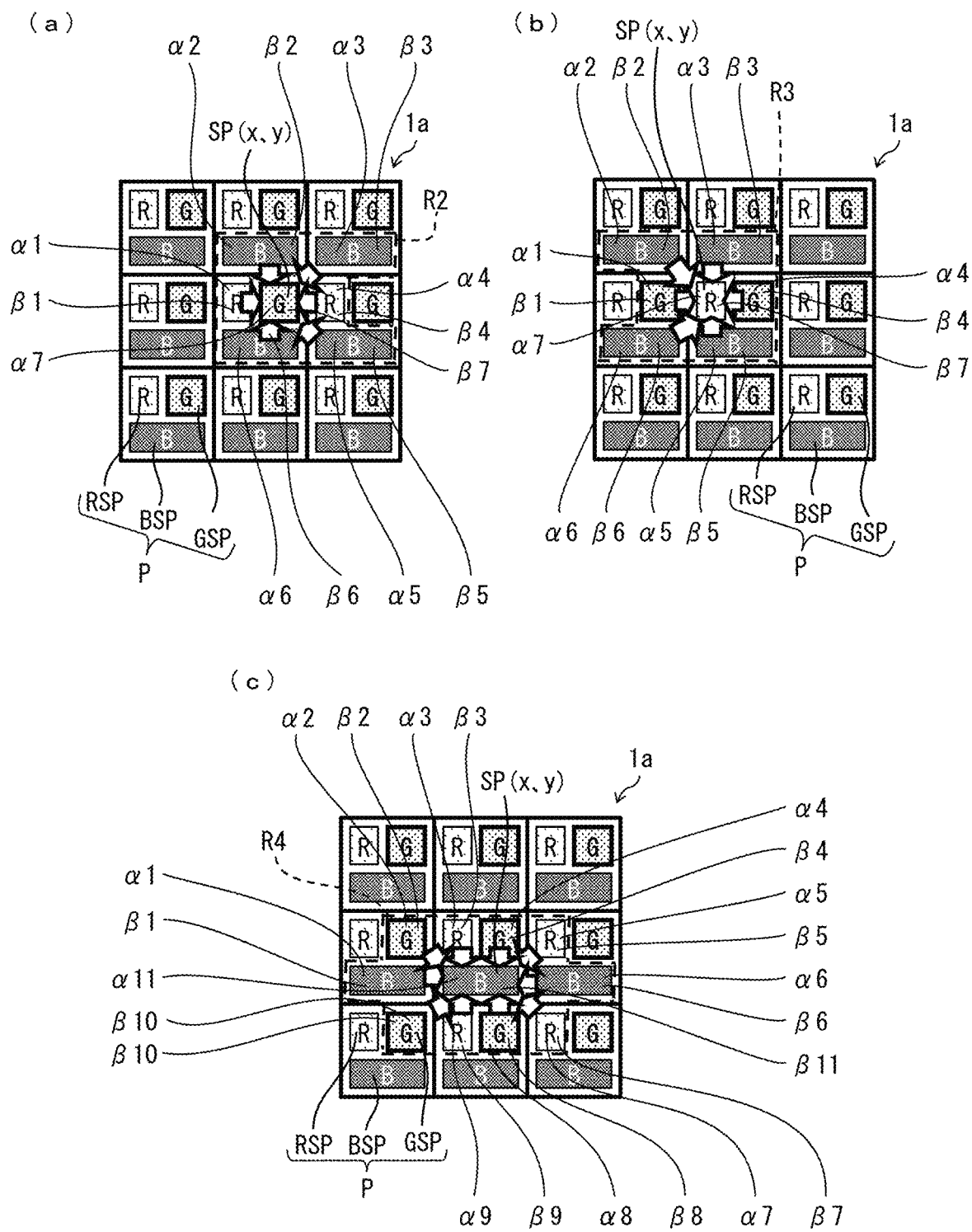
FIG. 7(a) illustrates a method for calculating a degradation amount of a light-emitting element included in a green subpixel of a display panel included in a display device of a third embodiment.
FIG. 7(b) illustrates a method for calculating a degradation amount of a light-emitting element included in a red subpixel of the display panel included in the display device of the third embodiment.
FIG. 7(c) illustrates a method for calculating a degradation amount of a light-emitting element included in a blue subpixel of the display panel included in the display device of the third embodiment.

Described next is a third embodiment of the disclosure, with reference to FIGS. 7 to 9. A display device 10b of this embodiment differs from the display devices described in the first and second embodiments in that the display device 10b includes a display panel 1a having a different subpixel arrangement. Otherwise, the display device 10b of this embodiment is the same as the display devices of the first and second embodiments. For convenience in description, like reference signs designate identical constituent features throughout the drawings between this embodiment and the first and second embodiments. These constituent features will not be elaborated upon.

FIG. 7(a) illustrates a method for calculating a degradation amount of a light-emitting element included in a green subpixel GSP of the display panel 1a included in the display device 10b of the third embodiment. FIG. 7(b) illustrates a method for calculating a degradation amount of a light-emitting element included in a red subpixel RSP of the display panel 1a included in the display device 10b of the third embodiment. FIG. 7(c) illustrates a method for calculating a degradation amount of a light-emitting element included in a blue subpixel BSP of the display panel 1a included in the display device 10b of the third embodiment.

As illustrated in FIG. 7(a), FIG. 7(b), and FIG. 7(c), each pixel P of the display panel 1a includes the red subpixel RSP, the green subpixel GSP, and the blue subpixel BSP. The blue subpixel BSP is larger in size than the red subpixel RSP and the green subpixel GSP. The green subpixel GSP is larger in size than the red subpixel RSP.

In this embodiment, as illustrated in FIG. 7(a), a region R2 is designated as an area of adjacent subpixels that exert influence on a degradation amount of a green light-emitting element (a first light-emitting element) included in a green first subpixel SP (x, y) of the display panel 1a. Furthermore, as illustrated in FIG. 7(b), a region R3 is designated as an area of adjacent subpixels that exert influence on a degradation amount of a red light-emitting element (a first light-emitting element) included in a red first subpixel SP (x, y) of the display panel 1a. Moreover, as illustrated in FIG. 7(c), a region R4 is designated as an area of adjacent subpixels that exert influence on a degradation amount of a blue light-emitting element (a first light-emitting element) included in a blue first subpixel SP (x, y) of the display panel 1a.

As illustrated in FIG. 7(a), the green first subpixel SP (x, y) of the display panel 1a is surrounded with six subpixels including: a second subpixel adjacent to the green first subpixel SP (x, y) (disposed to the left of the green first subpixel) and including a red light-emitting element (a second light-emitting element); a third subpixel adjacent to the green first subpixel SP (x, y) (disposed above the green first subpixel) and including a blue light-emitting element (a third light-emitting element); a fourth subpixel adjacent to the green first subpixel SP (x, y) (disposed to the above-right of the green first subpixel) and including a blue light-emitting element (a fourth light-emitting element); a fifth subpixel adjacent to the green first subpixel SP (x, y) (disposed to the right of the green first subpixel) and including a red light-emitting element (a fifth light-emitting element); a sixth subpixel adjacent to the green first subpixel SP (x, y) (disposed to the below-right of the green first subpixel) and including a blue light-emitting element (a sixth light-emitting element); and a seventh subpixel adjacent to the green first subpixel SP (x, y) (disposed below the green first subpixel) and including a blue light-emitting element (a seventh light-emitting element).

The degradation amount of the green light-emitting element (the first light-emitting element) included in the green first subpixel SP (x, y) is calculated in accordance with a light-emission state of the red light-emitting element (the second light-emitting element), a light-emission state of the blue light-emitting element (the third light-emitting element), a light-emission state of the blue light-emitting element (the fourth light-emitting element), a light-emission state of the red light-emitting element (the fifth light-emitting element), a light-emission state of the blue light-emitting element (the sixth light-emitting element), and a light-emission state of the blue light-emitting element (the seventh light-emitting element). The light-emitting elements are included in the respective six subpixels.

As illustrated in FIG. 7(b), the red first subpixel SP (x, y) of the display panel 1a is surrounded with six subpixels including: a second subpixel adjacent to the red first subpixel SP (x, y) (disposed to the left of the red first subpixel) and including a green light-emitting element (a second light-emitting element); a third subpixel adjacent to the red first subpixel SP (x, y) (disposed to the above-left of the red first subpixel) and including a blue light-emitting element (a third light-emitting element); a fourth subpixel adjacent to the red first subpixel SP (x, y) (disposed above the red first subpixel) and including a blue light-emitting element (a fourth light-emitting element); a fifth subpixel adjacent to the red first subpixel SP (x, y) (disposed to the right of the red first subpixel) and including a green light-emitting element (a fifth light-emitting element); a sixth subpixel adjacent to the red first subpixel SP (x, y) (disposed below the red first subpixel) and including a blue light-emitting element (a sixth light-emitting element); and a seventh subpixel adjacent to the red first subpixel SP (x, y) (disposed to the below-left of the red first subpixel) and including a blue light-emitting element (a seventh light-emitting element).

The degradation amount of the red light-emitting element (the first light-emitting element) included in the red first subpixel SP (x, y) is calculated in accordance with a light-emission state of the green light-emitting element (the second light-emitting element), a light-emission state of the blue light-emitting element (the third light-emitting element), a light-emission state of the blue light-emitting element (the fourth light-emitting element), a light-emission state of the green light-emitting element (the fifth light-emitting element), a light-emission state of the blue light-emitting element (the sixth light-emitting element), and a light-emission state of the blue light-emitting element (the seventh light-emitting element). The light-emitting elements are included in the respective six subpixels.

As illustrated in FIG. 7(c), the blue first subpixel SP (x, y) of the display panel 1a is surrounded with ten subpixels including: a second subpixel adjacent to the blue first subpixel SP (x, y) (disposed to the left of the blue first subpixel) and including a blue light-emitting element (a second light-emitting element); a third subpixel adjacent to the blue first subpixel SP (x, y) (disposed to the above-left of the blue first subpixel) and including a green light-emitting element (a third light-emitting element); a fourth subpixel adjacent to the blue first subpixel SP (x, y) (disposed above the blue first subpixel) and including a red light-emitting element (a fourth light-emitting element); a fifth subpixel adjacent to the blue first subpixel SP (x, y) (disposed above the blue first subpixel) and including a green light-emitting element (a fifth light-emitting element); a sixth subpixel adjacent to the blue first subpixel SP (x, y) (disposed to the above-right of the blue first subpixel) and including a red light-emitting element (a sixth light-emitting element); a seventh subpixel adjacent to the blue first subpixel SP (x, y) (disposed to the right of the blue first subpixel) and including a blue light-emitting element (a seventh light-emitting element); an eighth subpixel adjacent to the blue first subpixel SP (x, y) (disposed to the below-right of the blue first subpixel) and including a red light-emitting element (an eighth light-emitting element); a ninth subpixel adjacent to the blue first subpixel SP (x, y) (disposed below the blue first subpixel) and including a green light-emitting element (a ninth light-emitting element); a tenth subpixel adjacent to the blue first subpixel SP (x, y) (disposed below the blue first subpixel) and including a red light-emitting element (a tenth light-emitting element); and an eleventh subpixel adjacent to the blue first subpixel SP (x, y) (disposed to the below-left of the blue first subpixel) and including a green light-emitting element (an eleventh light-emitting element).

The degradation amount of the blue light-emitting element (the first light-emitting element) included in the blue first subpixel SP (x, y) is calculated in accordance with a light-emission state of the blue light-emitting element (the second light-emitting element), a light-emission state of the green light-emitting element (the third light-emitting element), a light-emission state of the red light-emitting element (the fourth light-emitting element), a light-emission state of the green light-emitting element (the fifth light-emitting element), a light-emission state of the red light-emitting element (the sixth light-emitting element), a light-emission state of the blue light-emitting element (the seventh light-emitting element), a light-emission state of the red light-emitting element (the eighth light-emitting element), a light-emission state of the green light-emitting element (the ninth light-emitting element), a light-emission state of the red light-emitting element (the tenth light-emitting element), and a light-emission state of the green light-emitting element (the eleventh light-emitting element). The light-emitting elements are included in the respective ten subpixels.

FIG. 8(a) illustrates a method for calculating a degradation amount of a light-emitting element included in a green subpixel of the display panel 1a included in the display device 10b of the third embodiment. FIG. 8(b) illustrates a method for calculating a degradation amount of a light-emitting element included in a red subpixel of the display panel 1a included in the display device 10b of the third embodiment. FIG. 8(c) illustrates a method for calculating a degradation amount of a light-emitting element included in a blue subpixel of the display panel 1a included in the display device 10b of the third embodiment.

Figure 9:
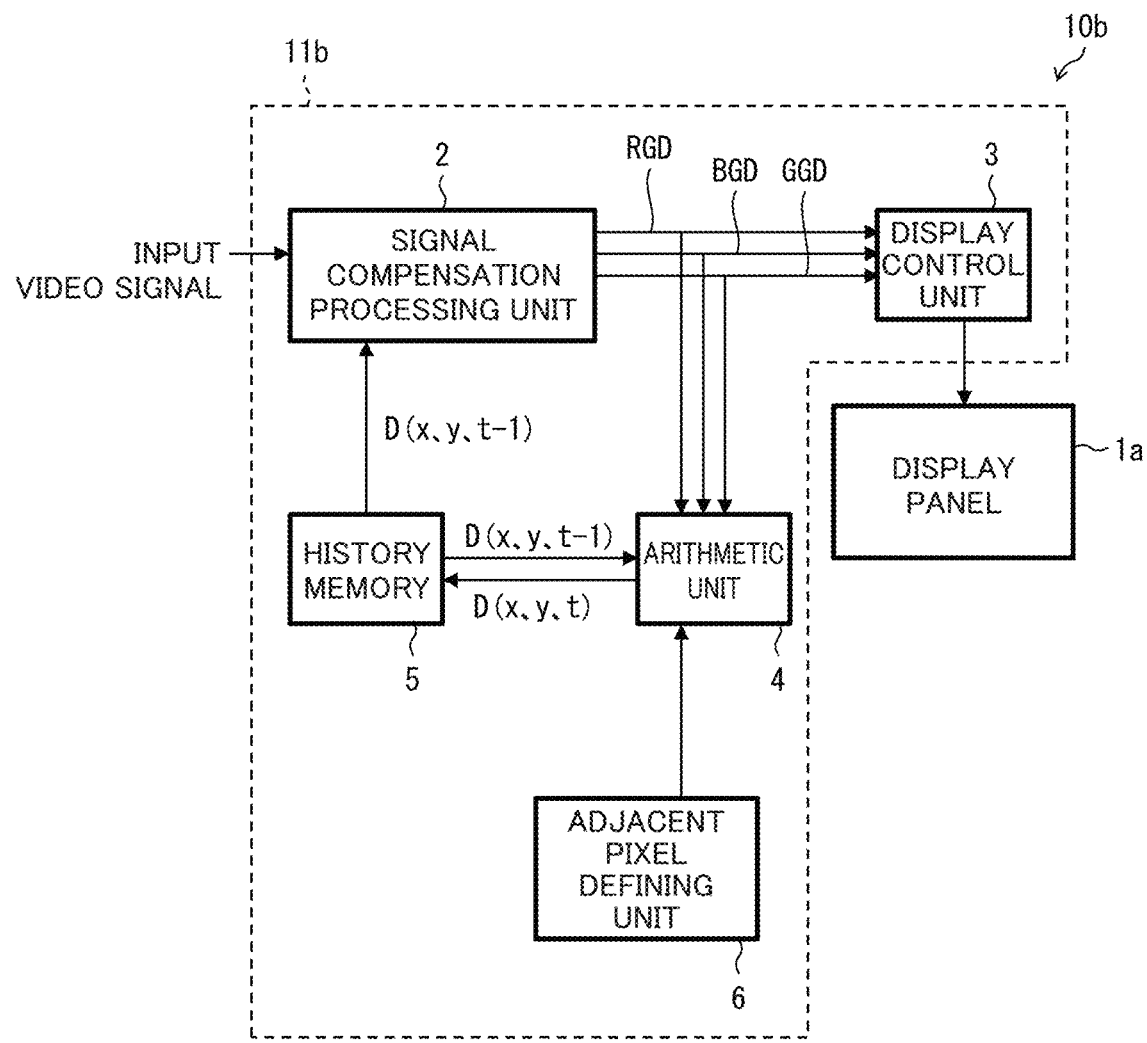
FIG. 9 illustrates a schematic configuration of a display device of a third embodiment.

FIG. 9 illustrates a schematic configuration of the display device 10b of the third embodiment.

As illustrated in FIG. 9, the circuit unit 11b of the display device 10b further includes an adjacent pixel defining unit 6 that defines a subpixel adjacent to the first subpixel SP (x, y).

The adjacent pixel defining unit 6 has data that defines a region of adjacent subpixels defined for each of a colored subpixel. For example, as illustrated in FIG. 7(a), the region R2 is defined for the green first subpixel SP (x, y) of the display panel 1a. As illustrated in FIG. 7(b), the region R3 is defined for the red first subpixel SP (x, y) of the display panel 1a. As illustrated in FIG. 7(c), the region R4 is defined for the blue first subpixel SP (x, y) of the display panel 1a.

As illustrated in FIG. 9, the video signal data RGD, BGD, and GGD sent from the signal compensation processing unit 2 to the arithmetic unit 4 includes coordinate data indicating a position of a subpixel, that is, address data. Hence, as illustrated in FIG. 8(a), FIG. 8(b), and FIG. 8(c), the circuit unit 11b can calculate a degradation amount in accordance with the data sent from the adjacent pixel defining unit 6 to the arithmetic unit 4 and defining the region of the adjacent subpixels defined for each of the colored subpixels.

As illustrated in FIG. 8(a), in the process of calculating a degradation amount of a light-emitting element included in a green subpixel of the display panel 1a included in the display device 10b, the circuit unit 11b can calculate the degradation amount, in accordance with the data sent from the adjacent pixel defining unit 6 to the arithmetic unit 4 and defining the region R2. using only the coordinate data indicating a position of a predetermined subpixel; that is, the video signal data RGD, BGD, and GGD having predetermined address data. Furthermore, as illustrated in FIG. 8(b), in the process of calculating a degradation amount of a light-emitting element included in a red subpixel of the display panel 1a included in the display device 10b, the circuit unit 11b can calculate the degradation amount, in accordance with the data sent from the adjacent pixel defining unit 6 to the arithmetic unit 4 and defining the region R3. using only the coordinate data indicating a position of a predetermined subpixel; that is, the video signal data RGD, BGD, and GGD having predetermined address data. Moreover, as illustrated in FIG. 8(c), in the process of calculating a degradation amount of a light-emitting element included in a blue subpixel of the display panel 1a included in the display device 10b, the circuit unit 11b can calculate the degradation amount, in accordance with the data sent from the adjacent pixel defining unit 6 to the arithmetic unit 4 and defining the region R4. using only the coordinate data indicating a position of a predetermined subpixel; that is, the video signal data RGD, BGD, and GGD having predetermined address data.

In this embodiment, for example, Equation 3 below can be used to calculate the current degradation amount D (x, y, t) of the green light-emitting element (the first light-emitting element) included in the green first subpixel SP (x, y) of the display panel 1a illustrated in FIG. 7(a), or the current degradation amount D (x, y, t) of the red light-emitting element (the first light-emitting element) included in the red first subpixel SP (x, y) of the display panel 1a illustrated in FIG. 7(b):

$$D(x, y, t) = D(x, y, t-1) + \alpha1\beta1 F\{G(x, y)\} + \\ \alpha2\beta2 F\{G(x, y)\} + \alpha3\beta3 F\{G(x, y)\} + \alpha4\beta4 F\{G(x, y)\} + \\ \alpha5\beta5 F\{G(x, y)\} + \alpha6\beta6 F\{G(x, y)\} + \alpha7\beta7 F\{G(x, y)\}.$$

(Equation 3)

In Equation 3, F{G (x, y)} is the degradation amount of the first light-emitting element included in the first subpixel SP (x, y) when influence of a subpixel adjacent to the first subpixel SP (x, y) is not factored in, each of α1 to α6 is a weighting coefficient based on a positional relationship between the first subpixel SP (x, y) and a subpixel adjacent to the first subpixel SP (x, y), each of β1 to β6 is a degradation promotion coefficient indicating a degree of influence, on the first subpixel SP (x, y), derived from a light-emission state of a light-emitting element included in the subpixel adjacent to the first subpixel SP (x, y), the light-emission state is determined by a grayscale value or a glowing period of the subpixel adjacent to the first subpixel SP (x, y), α7 is a weighting coefficient based on a positional relationship between the first subpixel SP (x, y) and the first light-emitting element included in the first subpixel SP (x, y), β7 is a degradation promotion coefficient indicating a degree of influence, on the first subpixel SP (x, y) itself, derived from a light-emission state of the first light-emitting element included in the first subpixel SP (x, y), and α7β7 is either 0 or 1, so that α7β7F {G (x, y)} is either 0 or F{G (x, y)}.

Note that each of β1 to β6 may be a degradation promotion coefficient indicating a degree of influence, on the first subpixel SP (x, y), derived from a degradation amount of a light-emitting element included in a subpixel adjacent to the first subpixel SP (x, y), and β7 may be a degradation promotion coefficient indicating a degree of influence, on the first subpixel SP (x, y) itself, derived from a degradation amount of the first light-emitting element included in the first subpixel SP (x, y).

In this embodiment, for example, Equation 4 below can be used to calculate the current degradation amount D (x, y, t) of the blue light-emitting element (the first light-emitting element) included in the blue first subpixel SP (x, y) of the display panel 1a illustrated in FIG. 7(c):

$$D(x, y, t) = \\ D(x, y, t-1) + \alpha 1\beta 1 F\{G(x, y)\} + \alpha 2\beta 2 F\{G(x, y)\} + \\ \alpha 3\beta 3 F\{G(x, y)\} + \alpha 4\beta 4 F\{G(x, y)\} + \alpha 5\beta 5 F\{G(x, y)\} + \\ \alpha 6\beta 6 F\{G(x, y)\} + \alpha 7\beta 7 F\{G(x, y)\} + \alpha 8\beta 8 F\{G(x, y)\} + \\ \alpha 9\beta 9 F\{G(x, y)\} + \alpha 10\beta 10 F\{G(x, y)\} + \alpha 11\beta 11 F\{G(x, y)\}.$$

(Equation 4)

In Equation 4, F{G (x, y)} is the degradation amount of the first light-emitting element when influence of a subpixel adjacent to the first subpixel SP (x, y) is not factored in, each of α1 to α10 is a weighting coefficient based on a positional relationship between the first subpixel SP (x, y) and a subpixel adjacent to the first subpixel SP (x, y), each of β1 to β10 is a degradation promotion coefficient indicating a degree of influence, on the first subpixel SP (x, y), derived from a light-emission state of a light-emitting element included in the subpixel adjacent to the first subpixel SP (x, y), the light-emission state is determined by a grayscale value or a glowing period of the subpixel adjacent to the first subpixel SP (x, y), α11 is a weighting coefficient based on a positional relationship between the first subpixel SP (x, y) and the first light-emitting element included in the first subpixel SP (x, y), β11 is a degradation promotion coefficient indicating a degree of influence, on the first subpixel SP (x, y) itself, derived from a light-emission state of the first light-emitting element included in the first subpixel SP (x, y), and α11β11 is either 0 or 1, so that α11β11F {G (x, y)} is either 0 or F{G (x, y)}.

Note that each of β1 to β10 may be a degradation promotion coefficient indicating a degree of influence, on the first subpixel SP (x, y), derived from a degradation amount of a light-emitting element included in a subpixel adjacent to the first subpixel SP (x, y), and β11 may be a degradation promotion coefficient indicating a degree of influence, on the first subpixel SP (x, y) itself, derived from a degradation amount of the first light-emitting element included in the first subpixel SP (x, y).

For example, instead of Equation 3 above, Equation 5 below can be used to calculate the current degradation amount D (x, y, t) of the green light-emitting element (the first light-emitting element) included in the green first subpixel SP (x, y) of the display panel 1a illustrated in FIG. 7(a), or the current degradation amount D (x, y, t) of the red light-emitting element (the first light-emitting element) included in the red first subpixel SP (x, y) of the display panel 1a illustrated in FIG. 7(b).

Equation 5 below differs from Equation 3 above in that the degradation amount F{G (x, y)} of the first light-emitting element is 1 when influence of a subpixel adjacent to the first subpixel SP (x, y) is not factored in.

$$D(x, y, t) = D(x, y, t-1) + \alpha 1\beta 1 + \\ \alpha 2\beta 2 + \alpha 3\beta 3 + \alpha 4\beta 4 + \alpha 5\beta 5 + \alpha 6\beta 6 + \alpha 7\beta 7.$$

(Equation 5)

In Equation 5, each of α1 to α6 is a weighting coefficient based on a positional relationship between the first subpixel SP (x, y) and a subpixel adjacent to the first subpixel SP (x, y), each of β1 to β6 is a degradation promotion coefficient indicating a degree of influence, on the first subpixel SP (x, y), derived from a light-emission state of a light-emitting element included in the subpixel adjacent to the first subpixel SP (x, y), the light-emission state is determined by a grayscale value or a glowing period of the subpixel adjacent to the first subpixel SP (x, y), α7 is a weighting coefficient based on a positional relationship between the first subpixel SP (x, y) and the first light-emitting element included in the first subpixel SP (x, y), and β7 is a degradation promotion coefficient indicating a degree of influence, on the first subpixel SP (x, y) itself, derived from a light-emission state of the first light-emitting element included in the first subpixel SP (x, y). Note that, in Equation 5 above, α7β7 is a value indicating the influence of the light-emission state of the first light-emitting element included in the first subpixel SP (x, y). The influence is exerted on the degradation of the first light-emitting element included in the first subpixel SP (x, y).

In this embodiment, instead of Equation 4 above, for example, Equation 6 below can be used to calculate the current degradation amount D (x, y, t) of the blue light-emitting element (the first light-emitting element) included in the blue first subpixel SP (x, y) of the display panel 1a illustrated in FIG. 7(c).

Equation 6 below differs from Equation 4 above in that the degradation amount F{G (x, y)} of the first light-emitting element is 1 when influence of a subpixel adjacent to the first subpixel SP (x, y) is not factored in.

$$D(x, y, t) = D(x, y, t-1) + \alpha 1\beta 1 + \alpha 2\beta 2 + \alpha 3\beta 3 + \alpha 4\beta 4 + \\ \alpha 5\beta 5 + \alpha 6\beta 6 + \alpha 7\beta 7 + \alpha 8\beta 8 + \alpha 9\beta 9 + \alpha 10\beta 10 + \alpha 11\beta 11.$$

(Equation 6)

In Equation 6, each of α1 to α10 is a weighting coefficient based on a positional relationship between the first subpixel SP (x, y) and a subpixel adjacent to the first subpixel SP (x, y), each of β1 to β10 is a degradation promotion coefficient indicating a degree of influence, on the first subpixel SP (x, y), derived from a light-emission state of a light-emitting element included in a subpixel adjacent to the first subpixel SP (x, y), the light-emission state is determined by a grayscale value or a glowing period of the subpixel adjacent to the first subpixel SP (x, y), α11 is a weighting coefficient based on a positional relationship between the first subpixel SP (x, y) and the first light-emitting element included in the first subpixel SP (x, y), and β11 is a degradation promotion coefficient indicating a degree of influence, on the first subpixel SP (x, y), derived from a light-emission state of the first light-emitting element included in the first subpixel SP (x, y). In Equation 6 above, α11β11 is a value indicating influence of the light-emission state of the first included in the subpixel SP (x, y). The influence is exerted on degradation of the first light-emitting element included in the first subpixel SP (x, y).

Note that each of β1 to β10 may be a degradation promotion coefficient indicating a degree of influence, on the first subpixel SP (x, y), derived from a degradation amount of a light-emitting element included in a subpixel adjacent to the first subpixel SP (x, y), and β11 may be a degradation promotion coefficient indicating a degree of influence, on the first subpixel SP (x, y) itself, derived from a degradation amount of the first light-emitting element included in the first subpixel SP (x, y).

As illustrated in FIG. 2(a) and FIG. 2(b), a comparison is made between the pixel P1-5 displayed with a grayscale level 255 for red, a grayscale level 0 for blue, and a grayscale level 255 for green and the pixel P3-5 displayed with a grayscale level 0 for red, a grayscale level 255 for blue, and a grayscale level 255 for green. The comparison shows that a degradation degree of the green light-emitting element included in the green subpixel of the pixel P3-5 is greater than a degradation degree of the green light-emitting element included in the green subpixel of the pixel P1-5. Likewise, a comparison is made between the pixel P1-6 displayed with a grayscale level 192 for red, a grayscale level 0 for blue, and a grayscale level 192 for green and the pixel P3-6 displayed with a grayscale level 0 for red, a grayscale level 192 for blue, and a grayscale level 192 for green. The comparison shows that a degradation degree of the green light-emitting element included in the green subpixel of the pixel P3-6 is greater than a degradation degree of the green light-emitting element included in the green subpixel of the pixel P1-6.

The above comparisons show that the degradation of a green light-emitting element included in a green subpixel is influenced more greatly by a light emission state of a blue light emitting-element included in an adjacent blue subpixel than by a light emission state of a red light-emitting element included in an adjacent red subpixel.

Hence, as seen in the display panel 1a of this embodiment, if the blue subpixel BSP is larger in size than the red subpixel RSP and the green subpixel GSP; that is, if the blue light-emitting element included in the blue subpixel BSP is larger in size than the red light-emitting element included in the red subpixel RSP and the green light-emitting element included in the green subpixel GSP, the weighting coefficient α based on a positional relationship between the first subpixel SP (x, y) and the light-emitting element included in the blue subpixel BSP adjacent to the first subpixel SP (x, y) is set preferably greater than either the weighting coefficient α based on a positional relationship between the first subpixel SP (x, y) and the light-emitting element included in the red subpixel RSP adjacent to the first subpixel SP (x, y) or the weighting coefficient α based on a positional relationship between the first subpixel SP (x, y) and the light-emitting element included in the green subpixel GSP adjacent to the first subpixel SP (x, y). The weighting coefficient α based on the positional relationship between the first subpixel SP (x, y) and a light-emitting element included in a subpixel adjacent to the first subpixel SP (x, y) may be proportional to a size of the light-emitting element included in the subpixel adjacent to the first subpixel SP (x, y).

As described above, the display device 10b of this embodiment, or the method for driving the display device 10b, can compensate for a degradation amount of the light-emitting element included in the first subpixel SP (x, y), while factoring in influence exerted by a light-emission state of a light-emitting element included in a subpixel adjacent to the first subpixel SP (x, y). Furthermore, the display device 10b of this embodiment, or the method for driving the display device 10b, can obtain with higher precision a degradation amount of the light-emitting element included in the first subpixel SP (x, y). In accordance with the degradation amount obtained with higher precision, the display device 10b of this embodiment, or the method for driving the display device 10b, can compensate for a degradation amount of a light-emitting element with higher accuracy.

Fourth Embodiment

Figure 10:
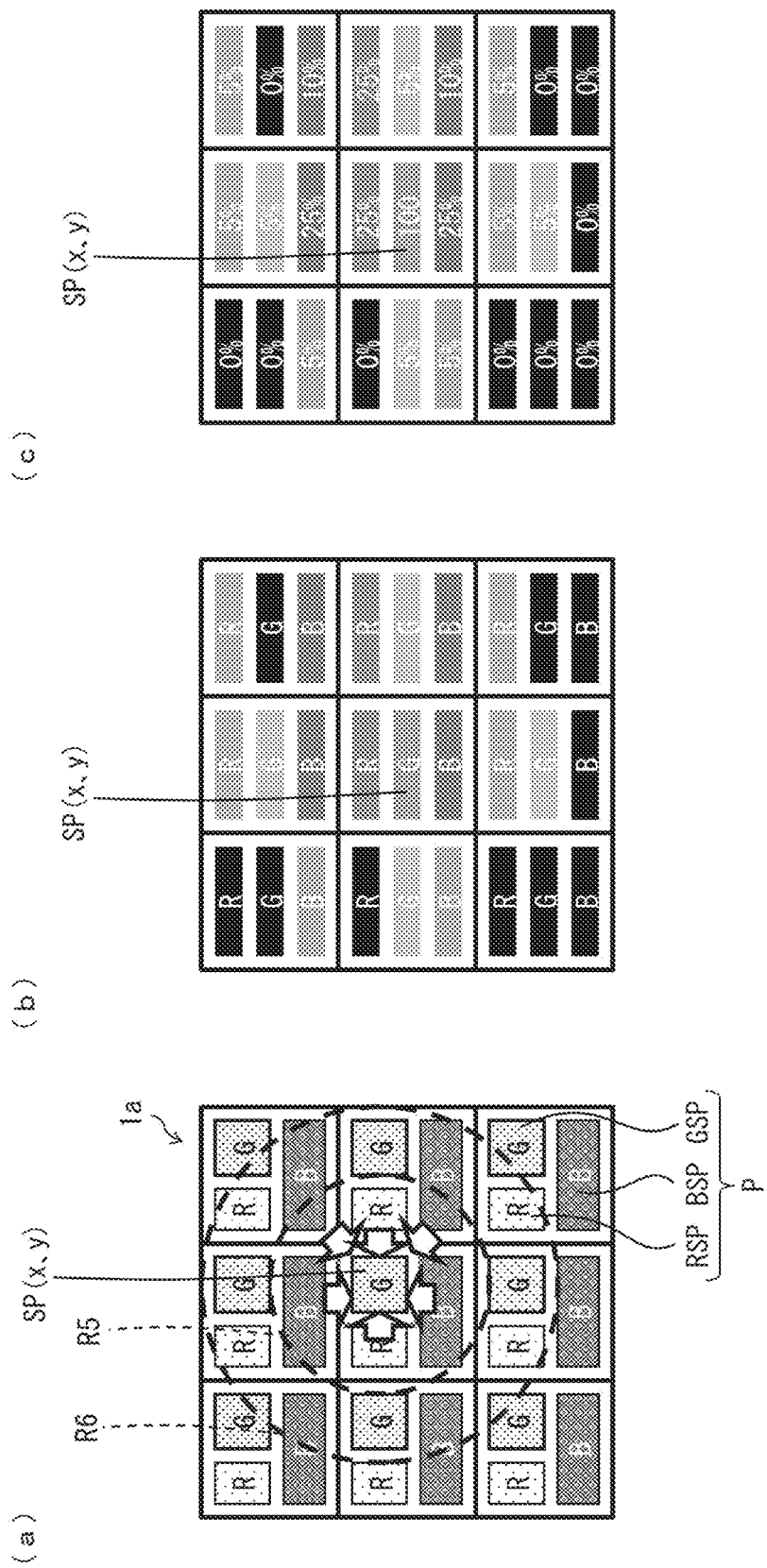
FIG. 10(a), FIG. 10(b), and FIG. 10(c) illustrate a method for calculating a degradation amount of a light-emitting element included in a green subpixel of a display panel included in a display device of a fourth embodiment.

Described next is a fourth embodiment of the disclosure, with reference to FIGS. 10 and 11. A display device 10c of this embodiment differs from the display device described in the third embodiment in that the area of adjacent subpixels are divided into a first region R5 and a second region R6. Here, the adjacent subpixels exert influence on a degradation amount of a green light-emitting element (a first light-emitting element) included in a green first subpixel SP (x, y) of the display panel 1a. Otherwise, the display device 10c of this embodiment is the same as the display device 10b of the third embodiment. For convenience in description, like reference signs designate identical constituent features throughout the drawings between this embodiment and the third embodiment. These constituent features will not be elaborated upon.

FIG. 10(a), FIG. 10(b), and FIG. 10(c) illustrate a method for calculating a degradation amount of a green light-emitting element included in a green subpixel GSP of the display panel 1a included in the display device 10c of the fourth embodiment.

Figure 11:
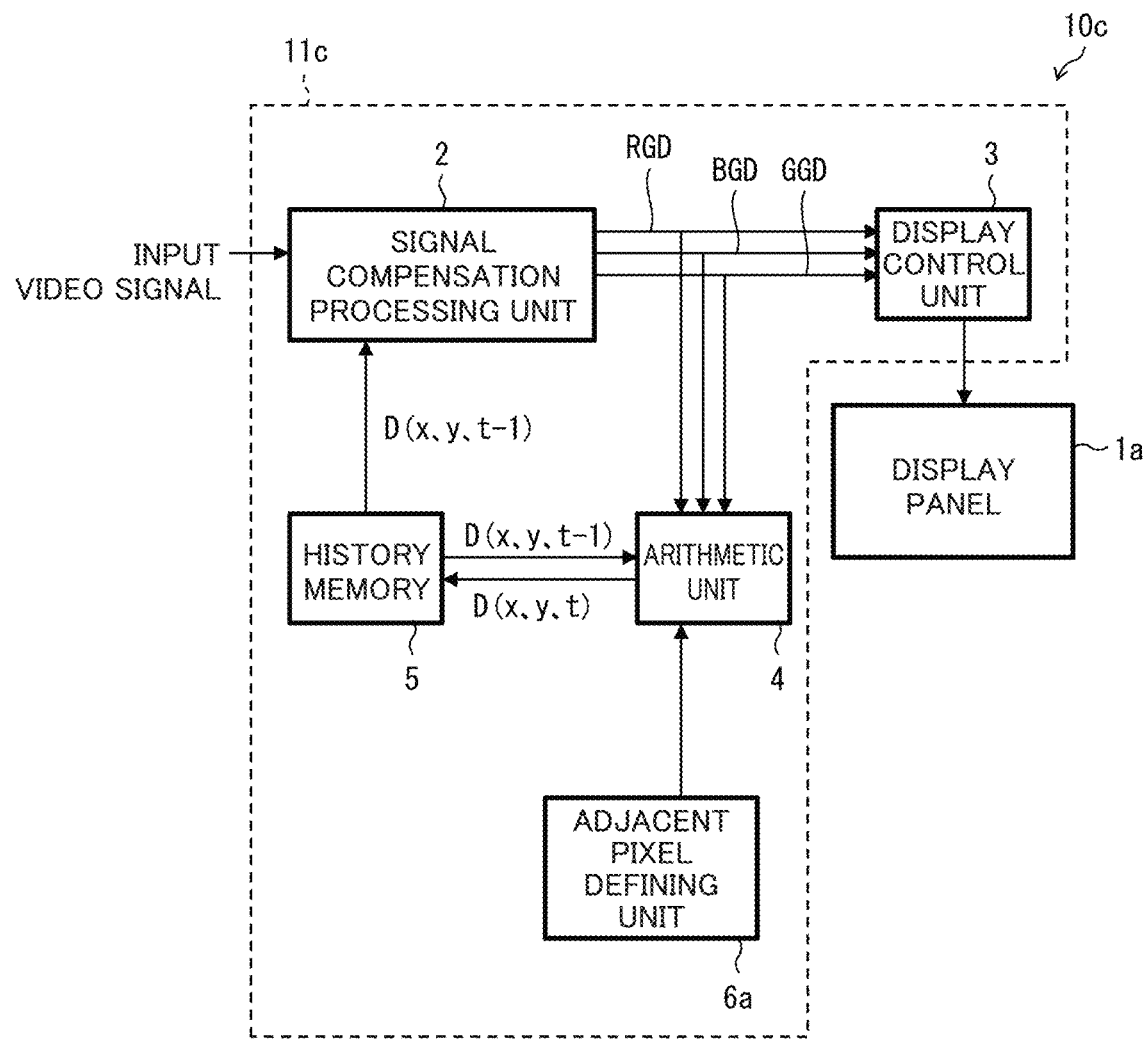
FIG. 11 illustrates a schematic configuration of the display device of the fourth embodiment.

FIG. 11 illustrates a schematic configuration of the display device 10c of the fourth embodiment.

As illustrated in FIG. 11, the circuit unit 11c of the display device 10c further includes an adjacent pixel defining unit 6a that defines a subpixel adjacent to a first subpixel SP (x, y) illustrated in FIG. 10(a).

As illustrated in, for example, FIG. 10(a), the adjacent pixel defining unit 6a defines an area of adjacent subpixels separately as a first region R5 and a second region R6. Here, the adjacent subpixels exert influence on a degradation amount of a green light-emitting element (a first light-emitting element) included in a green first subpixel SP (x, y) of the display panel 1a.

As illustrated in FIG. 10(a), the display panel 1a includes: the first region R5 extending from a center of the green first subpixel SP (x, y) of the display panel 1a within a certain distance; and the second region R6 surrounding the first region R5.

In this embodiment, in accordance with data sent from the adjacent pixel defining unit 6a and related to the first region R5 and the second region R6, the arithmetic unit 4 sets a weighting coefficient α, based on a positional relationship between the first subpixel SP (x, y) and a light-emitting element at least partially included in the first region R5, greater than a weighting coefficient α based on a positional relationship between the first subpixel SP (x, y) and a light-emitting element included either in the second region R6 alone or in both the second region R6 and a region out of the second region R6. Then, the arithmetic unit 4 calculates the degradation amount of the green light-emitting element (the first light-emitting element) included in the green first subpixel SP of the display panel 1a.

The arithmetic unit 4 may determine the weighting coefficient α based on the positional relationship between the first subpixel SP (x, y) and the light-emitting element at least partially included in the first region R5, in accordance with the data sent from the adjacent pixel defining unit 6a and related to the first region R5 and the second region R6. The weighting coefficient α may be determined, depending on a size of an area of the light-emitting element included in the first region R5.

Furthermore, the arithmetic unit 4 may determine the weighting coefficient α based on the positional relationship between the first subpixel SP (x, y) and the light-emitting element included either in the second region R6 alone or in both the second region R6 and the region out of the second region R6, in accordance with the data sent from the adjacent pixel defining unit 6a and related to the first region R5 and the second region R6. The weighting coefficient α may be determined, depending on a size of an area of the light-emitting element included in the second region R6.

In FIG. 10(b), the black subpixels represent subpixels whose weighting coefficient α, based on the positional relationship with the subpixel SP (x, y), is set to 0 (0%).

In this embodiment, as illustrated in FIG. 10(c), the weighting coefficient α set to 25 (25%) is based on a positional relationship between the first subpixel SP (x, y) and a light-emitting element either completely or mostly included in the first region R5 extending from the center of the green first subpixel SP (x, y) of the display panel 1a within a predetermined distance. Furthermore, the weighting coefficient α set to 10 (10%) is based on a positional relationship between the first subpixel SP (x, y) and a light-emitting element either completely or mostly included in both the first region R5 and the second region R6. The weighting coefficient α set to 5 (5%) is based on a positional relationship between the first subpixel SP (x, y) and a light-emitting element whose entire area or 50% of the area is included the second region R6.

As can be seen, the display device 10c of this embodiment, or the method for driving the display device 10c, can obtain a degradation amount of the light-emitting element included in the first subpixel SP (x, y), using the weighting coefficient α that varies depending on a distance from the center of the green first subpixel SP (x, y) of the display panel 1a. In accordance with the degradation amount obtained with higher precision, the display device 10c of this embodiment, or the method for driving the display device 10c, can compensate for a degradation amount of a light-emitting element with higher accuracy.

This embodiment exemplifies a case of calculating the degradation amount of the light-emitting element included in the green subpixel of the display panel 1a. However, this embodiment shall not be limited to such a case. This embodiment may also involve calculating a degradation amount of a light-emitting element included in a blue subpixel SP (x. y), and a degradation amount of a light-emitting element included in a red subpixel SP (x. y).

Fifth Embodiment

Figure 12:
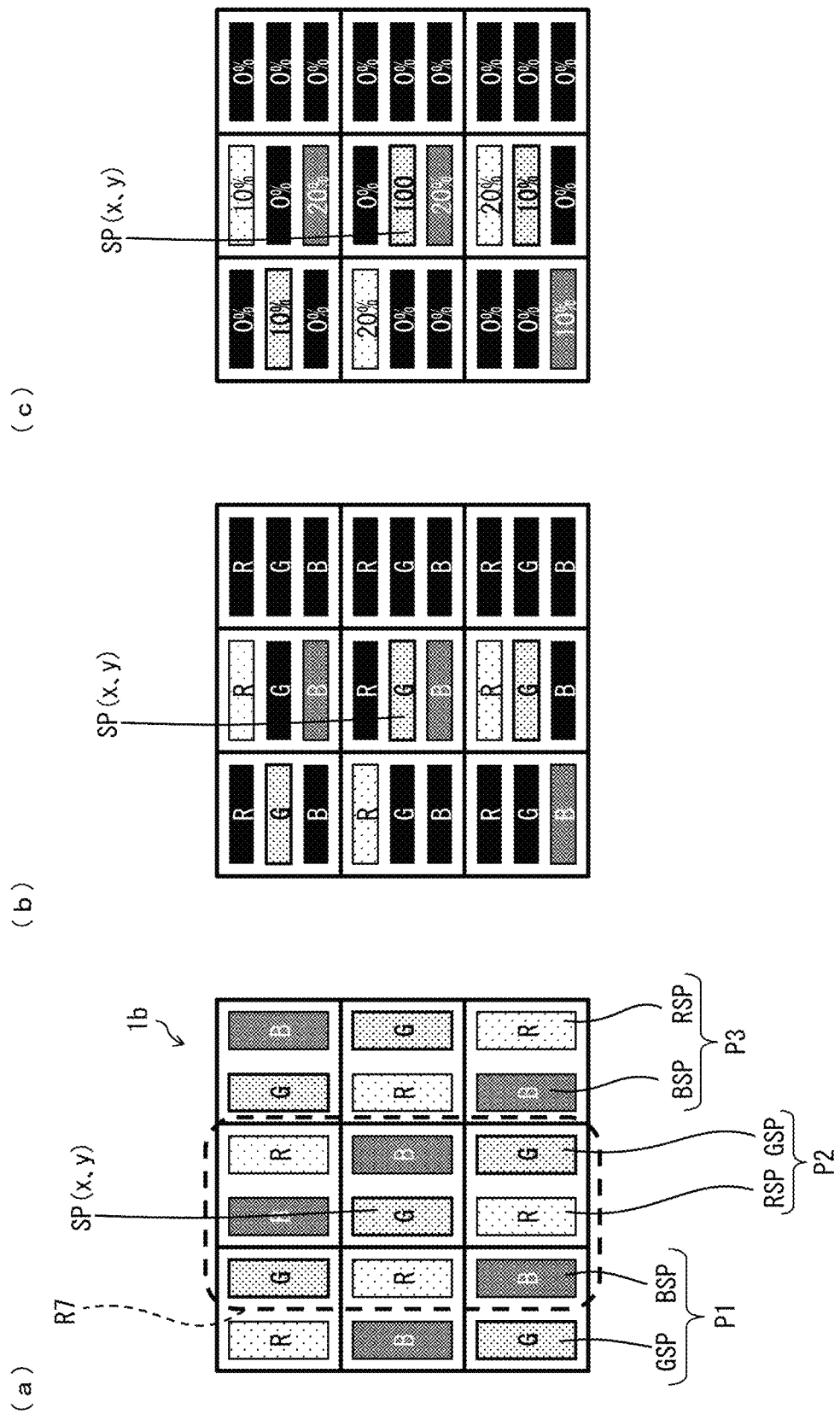
FIG. 12(a), FIG. 12(b), and FIG. 12(c) illustrate a method for calculating a degradation amount of a light-emitting element included in a green subpixel of a display panel included in a display device of a fifth embodiment.

Described next is a fifth embodiment of the disclosure, with reference to FIGS. 12 to 14. A display device 10d of this embodiment differs from the display devices described in the first and second embodiments in that the display device 10d includes a display panel 1b having a different subpixel arrangement. Otherwise, the display device 10d of this embodiment is the same as the display devices of the first and second embodiments. For convenience in description, like reference signs designate identical constituent features throughout the drawings between this embodiment and the first and second embodiments. These constituent features will not be elaborated upon.

FIG. 12(a), FIG. 12(b), and FIG. 12(c) illustrate a method for calculating a degradation amount of a light-emitting element included in a green subpixel GSP of the display panel 1b included in the display device 10d of the fifth embodiment.

As illustrated in FIG. 12(a), a pixel P1 of the display panel 1b includes a green subpixel GSP and a blue subpixel BSP. A pixel P2 of the display panel 1b includes a red subpixel RSP and a green subpixel GSP. A pixel P3 of the display panel 1b includes a blue subpixel BSP and a red subpixel RSP. Note that this embodiment exemplifies a case where the red subpixel RSP, the green subpixel GSP, and the blue subpixel BSP are the same in shape and size. However, this embodiment shall not be limited to such a case.

Figure 13:
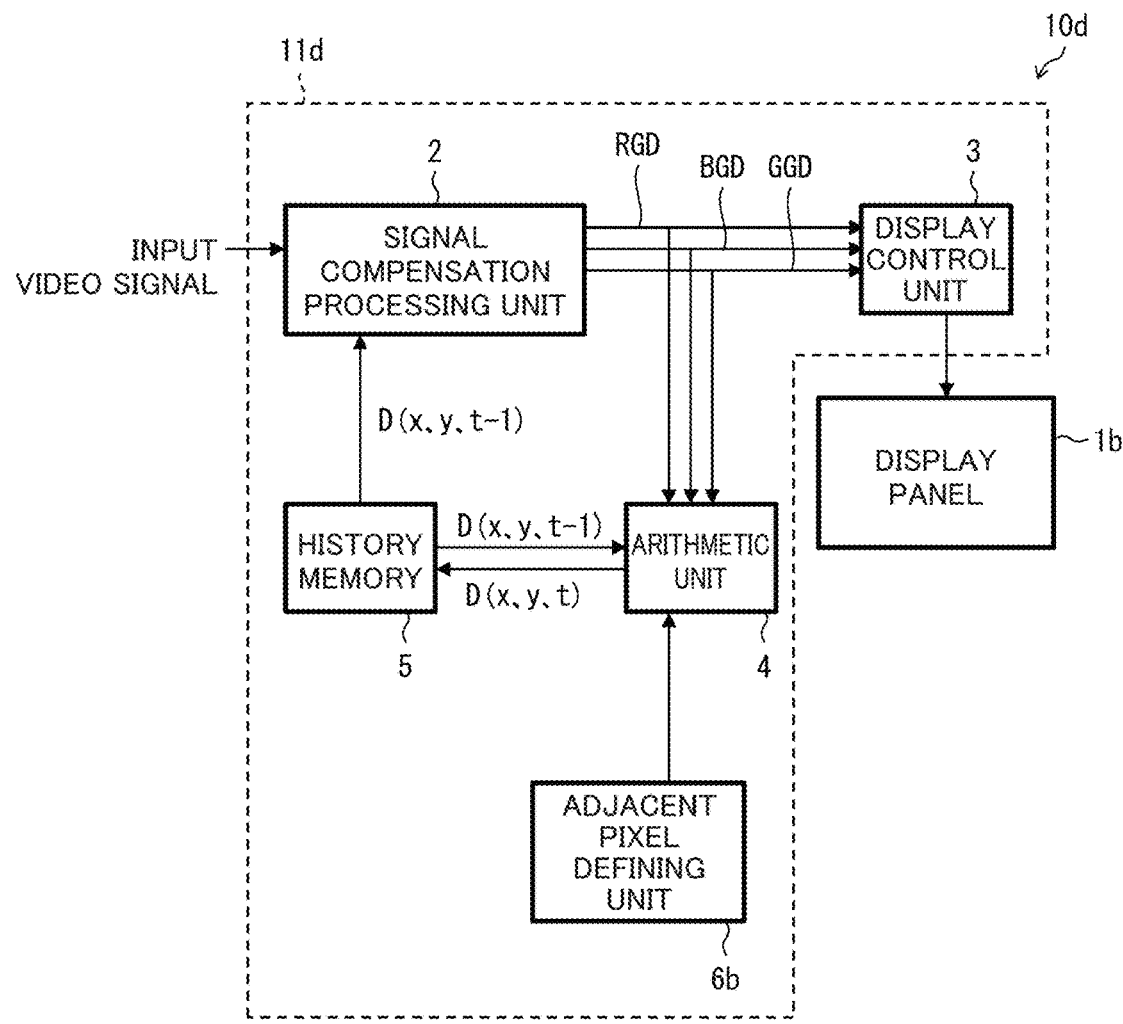
FIG. 13 illustrates a schematic configuration of the display device of the fifth embodiment.

FIG. 13 illustrates a schematic configuration of the display device 10d of the fifth embodiment.

As illustrated in FIG. 13, the display device 10d includes a circuit unit 11d. The circuit unit 11d further includes an adjacent pixel defining unit 6b that defines a region R7 (illustrated in FIG. 12(a)) of adjacent subpixels that exert influence on a degradation amount of a green light-emitting element (a first light-emitting element) included in a green first subpixel SP (x, y) of the display panel 1b.

As illustrated in FIG. 12(a), the green first subpixel SP (x, y) of the display panel 1b is surrounded with eight subpixels including: a second subpixel adjacent to the green first subpixel SP (x, y) (disposed to the left of the green first subpixel) and including a red light-emitting element (a second light-emitting element); a third subpixel adjacent to the green first subpixel SP (x, y) (disposed to the above-left of the green first subpixel) and including a green light-emitting element (a third light-emitting element); a fourth subpixel adjacent to the green first subpixel SP (x, y) (disposed above the green first subpixel) and including a blue light-emitting element (a fourth light-emitting element); a fifth subpixel adjacent to the green first subpixel SP (x, y) (disposed to the above-right of the green first subpixel) and including a red light-emitting element (a fifth light-emitting element); a sixth subpixel adjacent to the green first subpixel SP (x, y) (disposed to the right of the green first subpixel) and including a blue light-emitting element (a sixth light-emitting element); a seventh subpixel adjacent to the green first subpixel SP (x, y) (disposed to the below-right of the green first subpixel) and including a green light-emitting element (a seventh light-emitting element); an eighth subpixel adjacent to the green first subpixel SP (x, y) (disposed below the green first subpixel) and including a red light-emitting element (an eighth light-emitting element); and a ninth subpixel adjacent to the green first subpixel SP (x, y) (disposed to the below-left of the green first subpixel) and including a blue light-emitting element (a ninth light-emitting element). That is, the first to ninth subpixels are arranged in a three-by-three matrix.

In this embodiment, as illustrated in FIG. 12(a), if the green first subpixel SP (x, y) of the display panel 1b is a subpixel disposed in the second row and the second column, the arithmetic unit 4 sets a weighting coefficient α, based on a positional relationship between the first subpixel SP (x, y) and a light-emitting element included in a subpixel disposed in the same row or in the same column in which the green first subpixel SP (x, y) is disposed, greater than a weighting coefficient α based on a positional relationship between the first subpixel SP (x, y) and a light-emitting element included in a subpixel disposed in a different row and a in different column in which the green first subpixel SP (x, y) is not disposed. Then, the arithmetic unit 4 calculates a deterioration amount of a green light-emitting element (a first light-emitting element) included in the green first subpixel SP (x, y) of the display panel 1b.

That is, in this embodiment, the arithmetic unit 4 sets the weighting coefficient α, based on the positional relationship between the first subpixel SP (x, y) and a light-emitting element included in an adjacent subpixel disposed above or below, or to the left or to the right of, the green first subpixel SP (x, y) of the display panel 1b, greater than the weighting coefficient α based on the positional relationship between the first subpixel SP (x, y) and a light-emitting element included in an adjacent subpixel disposed to the above-right, the below-right, the above-left, or the below left of the green first subpixel SP (x, y) of the display panel 1b. Then, the arithmetic unit 4 calculates the degradation amount of the green light-emitting element (the first light-emitting element) included in the green first subpixel SP (x, y) of the display panel 1b. In FIG. 12(b), the black subpixels represent subpixels whose weighting coefficient α is set to 0 (0%).

In this embodiment, as illustrated in FIG. 12(c), the weighting coefficient α set to 10 (10%) is based on the positional relationship between the first subpixel SP (x, y) and a light-emitting included in an adjacent subpixel disposed to the above-right, the below-right, the above-left, or the below-left of the green first subpixel SP (x, y) of the display panel 1b. The weighting coefficient α set to 20 (20%) is based on the positional relationship between the first subpixel SP (x, y) and a light-emitting element included in an adjacent subpixel disposed above or below, or to the left or the right of, the green first subpixel SP (x, y) of the display panel 1b.

Figure 14:
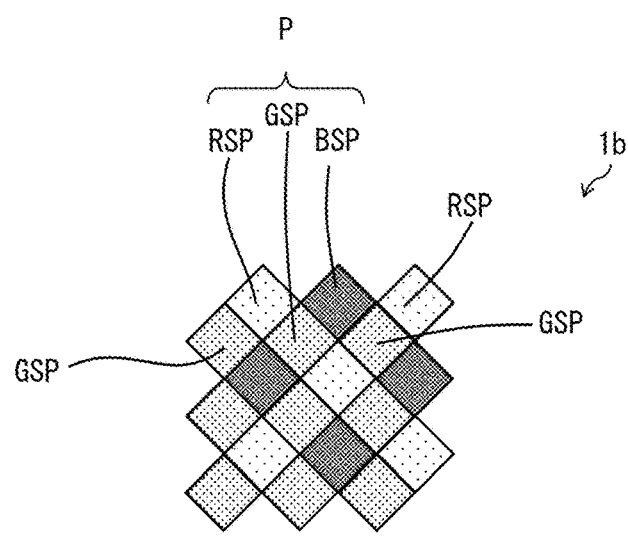
FIG. 14 illustrates an example of another display panel that can be included in the display device of the fifth embodiment.

FIG. 14 illustrates an example of another display panel 1b that can be included in the display device 10d of the fifth embodiment.

FIG. 14 is a view of a display panel in which red subpixels RSP, green subpixels GSP, and blue subpixels BSP are arranged in Pen Tile matrix.

The display device 10d includes the adjacent pixel defining unit 6b capable of flexibly defining an area of adjacent subpixels that exert influence on the degradation amount of the light-emitting element (the first light-emitting element) included in the first subpixel SP (x, y) of the display panel. Such a feature can be preferably applicable to a display panel in which colored subpixels are arranged in Pen Tile matrix as illustrated in FIG. 14.

As described above, the display device 10d of this embodiment, or the method for driving the display device 10d, can compensate for a degradation amount of the light-emitting element included in the first subpixel SP (x, y), while factoring in influence exerted by a light-emission state of a light-emitting element included in a subpixel adjacent to the first subpixel SP (x, y). Furthermore, the display device 10b of this embodiment, or the method for driving the display device 10b, can obtain with higher precision a degradation amount of the light-emitting element included in the first subpixel SP (x, y). In accordance with the degradation amount obtained with higher precision, the display device 10b of this embodiment, or the method for driving the display device 10b, can compensate for a degradation amount of a light-emitting element with higher accuracy.

SUMMARY

First Aspect

A display device including a display panel including: a first subpixel including a first light-emitting element; and a second subpixel adjacent to the first subpixel and including a second light-emitting element. The display device includes a circuit unit that calculates a degradation amount of the first light-emitting element in accordance with a light-emission state of the second light-emitting element, and that calculates a compensation value of the first light-emitting element in accordance with the calculated degradation amount of the first light-emitting element.

Second Aspect

As to the display device according to the first aspect, the first subpixel is surrounded with eight subpixels including the second subpixel, the eight subpixels further include: a third subpixel adjacent to the first subpixel and including a third light-emitting element; a fourth subpixel adjacent to the first subpixel and including a fourth light-emitting element; a fifth subpixel adjacent to the first subpixel and including a fifth light-emitting element; a sixth subpixel adjacent to the first subpixel and including a sixth light-emitting element; a seventh subpixel adjacent to the first subpixel and including a seventh light-emitting element; an eighth subpixel adjacent to the first subpixel and including an eighth light-emitting element; and a ninth subpixel adjacent to the first subpixel and including a ninth light-emitting element, and the circuit unit calculates the degradation amount of the first light-emitting element in accordance with: a light-emission state of the second light-emitting element; a light-emission state of the third-light emitting element; a light-emission state of the fourth light-emitting element; a light-emission state of the fifth light-emitting element; a light-emission state of the sixth light-emitting element; a light-emission state of the seventh light-emitting element, a light-emission state of the eighth light-emitting element; and a light-emission state of the ninth light-emitting element.

Third Aspect

As to the display device according to the first aspect, the first subpixel is surrounded with six subpixels including the second subpixel, the six subpixels further include: a third subpixel adjacent to the first subpixel and including a third light-emitting element; a fourth subpixel adjacent to the first subpixel and including a fourth light-emitting element; a fifth subpixel adjacent to the first subpixel and including a fifth light-emitting element; a sixth subpixel adjacent to the first subpixel and including a sixth light-emitting element; and a seventh subpixel adjacent to the first subpixel and including a seventh light-emitting element, and the circuit unit calculates the degradation amount of the first light-emitting element in accordance with: a light-emission state of the second light-emitting element; a light-emission state of the third-light emitting element; a light-emission state of the fourth light-emitting element; a light-emission state of the fifth light-emitting element; a light-emission state of the sixth light-emitting element; and a light-emission state of the seventh light-emitting element.

Fourth Aspect

As to the display device according to the first aspect, the first subpixel is surrounded with ten subpixels including the second subpixel, the ten subpixels further include: a third subpixel adjacent to the first subpixel and including a third light-emitting element; a fourth subpixel adjacent to the first subpixel and including a fourth light-emitting element; a fifth subpixel adjacent to the first subpixel and including a fifth light-emitting element; a sixth subpixel adjacent to the first subpixel and including a sixth light-emitting element; a seventh subpixel adjacent to the first subpixel and including a seventh light-emitting element; an eighth subpixel adjacent to the first subpixel and including an eighth light-emitting element; a ninth subpixel adjacent to the first subpixel and including a ninth light-emitting element; a tenth subpixel adjacent to the first subpixel and including a tenth light-emitting element; and an eleventh subpixel adjacent to the first subpixel and including an eleventh light-emitting element, and the circuit unit calculates the degradation amount of the first light-emitting element in accordance with: a light-emission state of the second light-emitting element; a light-emission state of the third-light emitting element; a light-emission state of the fourth light-emitting element; a light-emission state of the fifth light-emitting element; a light-emission state of the sixth light-emitting element; a light-emission state of the seventh light-emitting element, a light-emission state of the eighth light-emitting element; a light-emission state of the ninth light-emitting element; a light-emission state of the tenth light-emitting element; and a light-emission state of the eleventh light-emitting element.

Fifth Aspect

The display device according to any one of the first to fourth aspects further includes a first region extending from a center of the first subpixel within a certain distance, and a second region surrounding the first region.

The circuit unit: sets a weighting coefficient, based on a positional relationship between the first subpixel and a light-emitting element at least partially included in the first region, greater than a weighting coefficient based on a positional relationship between the first subpixel and a light-emitting element included either in the second region alone or in both the second region and a region out of the second region; and calculates the degradation amount of the first light-emitting element.

Sixth Aspect

As to the display device according to the fifth aspect, the circuit unit determines the weighting coefficient based on the positional relationship between the first subpixel and the light-emitting element at least partially included in the first region, the weighting coefficient being determined depending on a size of an area of the light-emitting element included in the first region.

Seventh Aspect

As to the display device according to the fifth or sixth aspect, the circuit unit determines the weighting coefficient based on the positional relationship between the first subpixel and the light-emitting element included either in the second region alone or in both the second region and the region out of the second region, the weighting coefficient being determined depending on a size of an area of the light-emitting element included in the second region.

Eighth Aspect

As to the display device according to the second aspect, the first subpixel, the second subpixel, the third subpixel, the fourth subpixel, the fifth subpixel, the sixth subpixel, the seventh subpixel, the eighth subpixel, and the ninth subpixel are arranged in a three-by-three matrix, and if first subpixel is a subpixel disposed in a second row and a second column, a weighting coefficient, based on a positional relationship between the first subpixel and a light-emitting element included in a subpixel disposed in a same row or a same column in which the first subpixel is disposed, is greater than a weighting coefficient based on a positional relationship between the first subpixel and a light-emitting element included in a subpixel disposed in a different row and a different column in which the subpixel is not disposed.

Ninth Aspect

As to the display device according to the second or eighth aspect, the circuit unit calculates a current degradation amount D (x, y, t) of the first light-emitting element, using Equation 1 below, in Equation 1 below, x and y represent coordinates of the first subpixel including the first light-emitting element, t represents time, D (x, y, t−1) represents a previous degradation amount of the first light-emitting element, F{G (x, y)} represents the degradation amount of the first light-emitting element when influence of a subpixel adjacent to the first subpixel is not factored in, α{i, j} represents a weighting coefficient based on a positional relationship with the first subpixel, β[F{G (x+i, y+j)}] represents a degradation promotion coefficient indicating a degree of influence, on the first subpixel, derived from a light-emission state of a light-emitting element included in the subpixel adjacent to the first subpixel, and the light-emission state is determined by a grayscale value or a glowing period of the subpixel adjacent to the first subpixel SP, and if i and j are 0, α{0, 0}β[F{G (x, y)}] is 0 or 1.

[Math. 1]

$$D(x, y, t) = D(x, y, t-1) + \sum_{\substack{\text{for each} \\ i=-1,0,1 \\ j=-1,0,1}} \alpha_{\{i,j\}} \beta_{[F\{G(x+i,y+j)\}]} \; F_{\{G(x,y)\}}. \quad \text{(Equation 1)}$$

Tenth Aspect

As to the display device according to the second or eighth aspect, the circuit unit calculates a current degradation amount D (x, y, t) of the first light-emitting element, using Equation 2 below, in Equation 2 below, x and y represent coordinates of the first subpixel including the first light-emitting element, t represents time, D (x, y, t−1) represents a previous degradation amount of the first light-emitting element, α{i, j} represents a weighting coefficient based on a positional relationship with the first subpixel, β[F{G (x+i, y+j)}] represents a degradation promotion coefficient indicating a degree of influence, on the first subpixel, derived from a light-emission state of a light-emitting element included in a subpixel adjacent to the first subpixel, and the light-emission state is determined by a grayscale value or a glowing period of the subpixel adjacent to the first subpixel, and if i and j are 0, $\alpha\{0, 0\}\beta[F\{G (x, y)\}]$ is 0 or 1.

[Math. 2]

$$D(x, y, t) = D(x, y, t-1) + \sum_{\substack{\text{for each} \\ i=-1,0,1 \\ j=-1,0,1}} \alpha_{\{i,j\}}\beta_{[F\{G(x+i,y+j)\}]}. \quad \text{(Equation 2)}$$

Eleventh Aspect

As to the display device according to the ninth or tenth aspect, a value of $\alpha\{i, j\}$ is a constant value regardless of values of i and j if i and j are other than 0.

Twelfth Aspect

As to the display device according to the third aspect, the circuit unit calculates a current degradation amount D (x, y, t) of the first light-emitting element, using Equation 3 below, and in Equation 3, $F\{G (x, y)\}$ is the degradation amount of the first light-emitting element when influence of a subpixel adjacent to the first subpixel is not factored in, each of $\alpha1$ to $\alpha6$ is a weighting coefficient based on a positional relationship between the first subpixel and a subpixel adjacent to the first subpixel, each of $\beta1$ to $\beta6$ is a degradation promotion coefficient indicating a degree of influence, on the first subpixel, derived from a light-emission state of a light-emitting element included in the subpixel adjacent to the first subpixel, the light-emission state is determined by a grayscale value or a glowing period of the subpixel adjacent to the first subpixel, $\alpha7$ is a weighting coefficient based on a positional relationship between the first subpixel and the first light-emitting element included in the first subpixel, $\beta7$ is a degradation promotion coefficient indicating a degree of influence, on the first subpixel, derived from a light-emission state of the first light-emitting element included in the first subpixel, and $\alpha7\beta7$ is either 0 or 1.

$$D (x, y, t) = D (x, y, t-1) + \alpha1\beta1F\{G (x, y)\} + \quad \text{(Equation 3)}$$
$$\alpha2\beta2F\{G (x, y)\} + \alpha3\beta3F\{G (x, y)\} + \alpha4\beta4F\{G (x, y)\} +$$
$$\alpha5\beta5F\{G (x, y)\} + \alpha6\beta6F\{G (x, y)\} + \alpha7\beta7F\{G (x, y)\}.$$

Thirteenth Aspect

As to the display device according to the fourth aspect, the circuit unit calculates a current degradation amount D (x, y, t) of the first light-emitting element, using Equation 4 below, and in Equation 4, $F\{G (x, y)\}$ is the degradation amount of the first light-emitting element when influence of a subpixel adjacent to the first subpixel is not factored in, each of $\alpha1$ to $\alpha10$ is a weighting coefficient based on a positional relationship between the first subpixel and a subpixel adjacent to the first subpixel, each of $\beta1$ to $\beta10$ is a degradation promotion coefficient indicating a degree of influence, on the first subpixel, derived from a light-emission state of a light-emitting element included in the subpixel adjacent to the first subpixel, the light-emission state is determined by a grayscale value or a glowing period of the subpixel adjacent to the first subpixel, $\alpha11$ is a weighting coefficient based on a positional relationship between the first subpixel and the first light-emitting element included in the first subpixel, $\beta7$ is a degradation promotion coefficient indicating a degree of influence, on the first subpixel, derived from a light-emission state of the first light-emitting element included in the first subpixel, and $\alpha11\beta11$ is either 0 or 1.

$$D (x, y, t) = D (x, y, t-1) + \alpha1\beta1F\{G (x, y)\} + \quad \text{(Equation 4)}$$
$$\alpha2\beta2F\{G (x, y)\} + \alpha3\beta3F\{G (x, y)\} +$$
$$\alpha4\beta4F\{G (x, y)\} + \alpha5\beta5F\{G (x, y)\} + \alpha6\beta6F\{G (x, y)\} +$$
$$\alpha7\beta7F\{G (x, y)\} + \alpha8\beta8F\{G (x, y)\} + \alpha9\beta9F\{G (x, y)\} +$$
$$\alpha10\beta10F\{G (x, y)\} + \alpha11\beta11F\{G (x, y)\}.$$

Fourteenth Aspect

As to the display device according to the third aspect, the circuit unit calculates a current degradation amount D (x, y, t) of the first light-emitting element, using Equation 5 below, and in Equation 5, each of $\alpha1$ to $\alpha6$ is a weighting coefficient based on a positional relationship between the first subpixel and a subpixel adjacent to the first subpixel, each of $\beta1$ to $\beta6$ is a degradation promotion coefficient indicating a degree of influence, on the first subpixel, derived from a light-emission state of a light-emitting element included in the subpixel adjacent to the first subpixel, the light-emission state is determined by a grayscale value or a glowing period of the subpixel adjacent to the first subpixel, $\alpha7$ is a weighting coefficient based on a positional relationship between the first subpixel and the first light-emitting element included in the first subpixel, $\beta7$ is a degradation promotion coefficient indicating a degree of influence, on the first subpixel, derived from a light-emission state of the first light-emitting element included in the first subpixel, and $\alpha7\beta7$ is either 0 or 1.

$$D (x, y, t) = D (x, y, t-1) + \alpha1\beta1 + \quad \text{(Equation 5)}$$
$$\alpha2\beta2 + \alpha3\beta3 + \alpha4\beta4 + \alpha5\beta5 + \alpha6\beta6 + \alpha7\beta7.$$

Fifteenth Aspect

As to the display device according to the fourth aspect, the circuit unit calculates a current degradation amount D (x, y, t) of the first light-emitting element, using Equation 6 below, and in Equation 6, each of $\alpha1$ to $\alpha10$ is a weighting coefficient based on a positional relationship between the first subpixel and a subpixel adjacent to the first subpixel, each of β1 to β10 is a degradation promotion coefficient indicating a degree of influence, on the first subpixel, derived from a light-emission state of a light-emitting element included in the subpixel adjacent to the first subpixel, the light-emission state is determined by a grayscale value or a glowing period of the subpixel adjacent to the first subpixel, α11 is a weighting coefficient based on a positional relationship between the first subpixel and the first light-emitting element included in the first subpixel, β11 is a degradation promotion coefficient indicating a degree of influence, on the first subpixel, derived from a light-emission state of the first light-emitting element included in the first subpixel, and α11β11 is either 0 or 1.

$$D(x, y, t) = D(x, y, t-1) + \alpha 1\beta 1 + \alpha 2\beta 2 + \alpha 3\beta 3 + \alpha 4\beta 4 + \quad \text{(Equation 6)}$$
$$\alpha 5\beta 5 + \alpha 6\beta 6 + \alpha 7\beta 7 + \alpha 8\beta 8 + \alpha 9\beta 9 + \alpha 10\beta 10 + \alpha 11\beta 11.$$

Sixteenth Aspect

As to the display device according to any one of the fifth to tenth and twelfth to fifteenth aspects, a weighting coefficient based on a positional relationship between the first subpixel and a light-emitting element included in a subpixel adjacent to the first subpixel is proportional to a size of the light-emitting element included in the subpixel adjacent to the first subpixel.

Seventeenth Aspect

As to the display device according to any one of the ninth to fifteenth aspects, the degradation promotion coefficient is a coefficient derived from a degradation amount of the light-emitting element.

Eighteenth Aspect

As to the display device according to any one of the first to seventeenth aspect, the circuit unit further includes an adjacent pixel defining unit that defines an adjacent subpixel including the second subpixel adjacent to the first subpixel.

Nineteenth Aspect

A method for driving a display device including a display panel including: a first subpixel including a first light-emitting element; and a second subpixel adjacent to the first subpixel and including a second light-emitting element. The method includes:
calculating a degradation amount of the first light-emitting element in accordance with a light-emission state of the second light-emitting element; and calculating a compensation value of the first light-emitting element in accordance with the calculated degradation amount of the first light-emitting element.

Additionally Remarks

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined together to achieve a new technical feature.

INDUSTRIAL APPLICABILITY

The disclosure is applicable to a display device and a method for driving the display device.

The invention claimed is:
1. A display device comprising:
a display panel including:
a first subpixel including a first light-emitting element, and
a second subpixel adjacent to the first subpixel and including a second light-emitting element;
a circuit unit configured to calculate a degradation amount of the first light-emitting element in accordance with a light-emission state of the second light-emitting element, and to calculate a compensation value of the first light-emitting element in accordance with the calculated degradation amount of the first light-emitting element;
a first region extending from a center of the first subpixel; and
a second region surrounding the first region,
wherein the circuit unit is further configured to:
set a weighting coefficient, based on a positional relationship between the first subpixel and a light-emitting element at least partially included in the first region, greater than a weighting coefficient that is determined based on a positional relationship between the first subpixel and a light-emitting element included either in the second region alone or in both the second region and a region out of the second region, and
calculate the degradation amount of the first light-emitting element.
2. The display device according to claim 1,
wherein the first subpixel is surrounded with eight subpixels including the second subpixel, the eight subpixels further include:
a third subpixel adjacent to the first subpixel and including a third light-emitting element,
a fourth subpixel adjacent to the first subpixel and including a fourth light-emitting element,
a fifth subpixel adjacent to the first subpixel and including a fifth light-emitting element,
a sixth subpixel adjacent to the first subpixel and including a sixth light-emitting element,
a seventh subpixel adjacent to the first subpixel and including a seventh light-emitting element;
an eighth subpixel adjacent to the first subpixel and including an eighth light-emitting element, and
a ninth subpixel adjacent to the first subpixel and including a ninth light-emitting element, and
the circuit unit calculates the degradation amount of the first light-emitting element in accordance with:
a light-emission state of the second light-emitting element,
a light-emission state of the third-light emitting element,
a light-emission state of the fourth light-emitting element,
a light-emission state of the fifth light-emitting element, a light-emission state of the sixth light-emitting element,
a light-emission state of the seventh light-emitting element,
a light-emission state of the eighth light-emitting element, and
a light-emission state of the ninth light-emitting element.

3. The display device according to claim 1, wherein the first region extends from the center of the first subpixel within a center distance.

4. The display device according to claim 1,
wherein the circuit unit determines the weighting coefficient based on the positional relationship between the first subpixel and the light-emitting element at least partially included in the first region, the weighting coefficient being determined based on a size of an area of the light-emitting element included in the first region.

5. The display device according to claim 1,
wherein the circuit unit determines the weighting coefficient based on the positional relationship between the first subpixel and the light-emitting element included either in the second region alone or in both the second region and the region out of the second region, the weighting coefficient being determined based on a size of an area of the light-emitting element included in the second region.

6. The display device according to claim 1,
wherein a weighting coefficient, based on a positional relationship between the first subpixel and a light-emitting element included in a subpixel adjacent to the first subpixel, is proportional to a size of the light-emitting element included in the subpixel adjacent to the first subpixel.

7. The display device according to claim 1,
wherein the circuit unit includes an adjacent pixel defining unit configured to define an adjacent subpixel including the second subpixel.

8. The display device according to claim 2,
wherein the first subpixel, the second subpixel, the third subpixel, the fourth subpixel, the fifth subpixel, the sixth subpixel, the seventh subpixel, the eighth subpixel, and the ninth subpixel are arranged in a three-by-three matrix,
if the first subpixel is a subpixel disposed in a second row and a second column, a weighting coefficient, based on a positional relationship between the first subpixel and a light-emitting element included in a subpixel disposed in a same row or a same column in which the first subpixel is disposed, is greater than a weighting coefficient that is determined based on a positional relationship between the first subpixel and a light-emitting element included in a subpixel disposed in a different row and a different column in which the first subpixel is not disposed,
the light-emitting element, at least partially included in the first region, is included in the subpixel disposed in the same row or the same column in which the first subpixel disposed, and
the light-emitting element, included in the second region alone, is included in the subpixel disposed in the different row and the different column in which the first subpixel is not disposed.

9. The display device according to claim 8,
wherein the circuit unit calculates a current degradation amount D (x, y, t) of the first light-emitting element, using Equation 1 below,
in Equation 1 below, x and y represent coordinates of the first subpixel including the first light-emitting element, t represents time, D (x, y, t−1) represents a previous degradation amount of the first light-emitting element, F{G (x, y)} represents the degradation amount of the first light-emitting element when influence of a subpixel adjacent to the first subpixel is not factored in, α{i, j} represents a weighting coefficient based on a positional relationship with the first subpixel, β[F {G (x+i, y+j)}] represents a degradation promotion coefficient indicating a degree of influence, on the first subpixel, derived from a light-emission state of a light-emitting element included in the subpixel adjacent to the first subpixel, and the light-emission state is determined by a grayscale value or a glowing period of the subpixel adjacent to the first subpixel SP, and
if i and j are 0, α{0, 0}β[F{G (x, y)}] is 0 or 1, and

[Math. 1]

$$D(x, y, t) = D(x, y, t-1) + \sum_{\substack{\text{for each} \\ i=-1,0,1 \\ j=-1,0,1}} \alpha_{\{i,j\}} \beta_{[F\{G(x+i,y+j)\}]} \, F_{\{G(x,y)\}}. \quad \text{(Equation 1)}$$

10. The display device according to claim 8,
wherein the circuit unit calculates a current degradation amount D (x, y, t) of the first light-emitting element, using Equation 2 below,
in Equation 2 below, x and y represent coordinates of the first subpixel including the first light-emitting element, t represents time, D (x, y, t−1) represents a previous degradation amount of the first light-emitting element, α{i, j} represents a weighting coefficient based on a positional relationship with the first subpixel, β[F{G (x+i, y+j)}] represents a degradation promotion coefficient indicating a degree of influence, on the first subpixel, derived from a light-emission state of a light-emitting element included in a subpixel adjacent to the first subpixel, and the light-emission state is determined by a grayscale value or a glowing period of the subpixel adjacent to the first subpixel,
if i and j are 0, α{0, 0}β[F{G (x, y)}] is 0 or 1, and

[Math. 2]

$$D(x, y, t) = D(x, y, t-1) + \sum_{\substack{\text{for each} \\ i=-1,0,1 \\ j=-1,0,1}} \alpha_{\{i,j\}} \beta_{[F\{G(x+i,y+j)\}]}. \quad \text{(Equation 2)}$$

11. The display device according to claim 9,
a value of α{i, j} is a constant value regardless of values of i and j if i and j are other than 0.

12. The display device according to claim 9,
wherein the degradation promotion coefficient is a coefficient derived from a degradation amount of a relevant light-emitting element.

13. A display device comprising:
a display panel including:
   a first subpixel including a first light-emitting element, and
   a second subpixel adjacent to the first subpixel and including a second light-emitting element; and
a circuit unit configured to calculate a degradation amount of the first light-emitting element in accordance with a light-emission state of the second light-emitting element, and to calculate a compensation value of the first light-emitting element in accordance with the calculated degradation amount of the first light-emitting element,
wherein the first subpixel is surrounded with six subpixels including the second subpixel,
the six subpixels further include:
   a third subpixel adjacent to the first subpixel and including a third light-emitting element,
   a fourth subpixel adjacent to the first subpixel and including a fourth light-emitting element,
   a fifth subpixel adjacent to the first subpixel and including a fifth light-emitting element,
   a sixth subpixel adjacent to the first subpixel and including a sixth light-emitting element, and
   a seventh subpixel adjacent to the first subpixel and including a seventh light-emitting element, and
the circuit unit calculates the degradation amount of the first light-emitting element in accordance with:
   a light-emission state of the second light-emitting element,
   a light-emission state of the third-light emitting element,
   a light-emission state of the fourth light-emitting element,
   a light-emission state of the fifth light-emitting element,
   a light-emission state of the sixth light-emitting element, and
   a light-emission state of the seventh light-emitting element.

14. The display device according to claim 13,
wherein the circuit unit calculates a current degradation amount D (x, y, t) of the first light-emitting element, using Equation 5 below,
in Equation 5, each of $\alpha 1$ to $\alpha 6$ is a weighting coefficient based on a positional relationship between the first subpixel and a subpixel adjacent to the first subpixel, each of $\beta 1$ to $\beta 6$ is a degradation promotion coefficient indicating a degree of influence, on the first subpixel, derived from a light-emission state of a light-emitting element included in the subpixel adjacent to the first subpixel, the light-emission state is determined by a grayscale value or a glowing period of the subpixel adjacent to the first subpixel, $\alpha 7$ is a weighting coefficient based on a positional relationship between the first subpixel and the first light-emitting element included in the first subpixel, $\beta 7$ is a degradation promotion coefficient indicating a degree of influence, on the first subpixel, derived from a light-emission state of the first light-emitting element included in the first subpixel, and $\alpha 7 \beta 7$ is either 0 or 1, and $$D(x, y, t) = D(x, y, t-1) + \alpha 1 \beta 1 + \alpha 2 \beta 2 + \alpha 3 \beta 3 + \alpha 4 \beta 4 + \alpha 5 \beta 5 + \alpha 6 \beta 6 + \alpha 7 \beta 7. \quad \text{(Equation 5)}$$

15. The display device according to claim 13,
wherein the circuit unit calculates a current degradation amount D (x, y, t) of the first light-emitting element, using Equation 3 below,
in Equation 3, F{G (x, y)} is the degradation amount of the first light-emitting element when influence of a subpixel adjacent to the first subpixel is not factored in, each of $\alpha 1$ to $\alpha 6$ is a weighting coefficient based on a positional relationship between the first subpixel and a subpixel adjacent to the first subpixel, each of $\beta 1$ to $\beta 6$ is a degradation promotion coefficient indicating a degree of influence, on the first subpixel, derived from a light-emission state of a light-emitting element included in the subpixel adjacent to the first subpixel, the light-emission state is determined by a grayscale value or a glowing period of the subpixel adjacent to the first subpixel, $\alpha 7$ is a weighting coefficient based on a positional relationship between the first subpixel and the first light-emitting element included in the first subpixel, $\beta 7$ is a degradation promotion coefficient indicating a degree of influence, on the first subpixel, derived from a light-emission state of the first light-emitting element included in the first subpixel, and $\alpha 7 \beta 7$ is either 0 or 1, and $$D(x, y, t) = D(x, y, t-1) + \alpha 1 \beta 1 F\{G(x, y)\} + \alpha 2 \beta 2 F\{G(x, y)\} + \alpha 3 \beta 3 F\{G(x, y)\} + \alpha 4 \beta 4 F\{G(x, y)\} + \alpha 5 \beta 5 F\{G(x, y)\} + \alpha 6 \beta 6 F\{G(x, y)\} + \alpha 7 \beta 7 F\{G(x, y)\}. \quad \text{(Equation 3)}$$

16. A display device comprising:
a display panel including:
   a first subpixel including a first light-emitting element, and
   a second subpixel adjacent to the first subpixel and including a second light-emitting element; and
a circuit unit configured to calculate a degradation amount of the first light-emitting element in accordance with a light-emission state of the second light-emitting element, and to calculate a compensation value of the first light-emitting element in accordance with the calculated degradation amount of the first light-emitting element,
wherein the first subpixel is surrounded with ten subpixels including the second subpixel, the ten subpixels further include:
   a third subpixel adjacent to the first subpixel and including a third light-emitting element,
   a fourth subpixel adjacent to the first subpixel and including a fourth light-emitting element,
   a fifth subpixel adjacent to the first subpixel and including a fifth light-emitting element,
   a sixth subpixel adjacent to the first subpixel and including a sixth light-emitting element,
   a seventh subpixel adjacent to the first subpixel and including a seventh light-emitting element,
   an eighth subpixel adjacent to the first subpixel and including an eighth light-emitting element,
   a ninth subpixel adjacent to the first subpixel and including a ninth light-emitting element, a tenth subpixel adjacent to the first subpixel and including a tenth light-emitting element, and an eleventh subpixel adjacent to the first subpixel and including an eleventh light-emitting element, and the circuit unit calculates the degradation amount of the first light-emitting element in accordance with:

a light-emission state of the second light-emitting element, a light-emission state of the third-light emitting element, a light-emission state of the fourth light-emitting element, a light-emission state of the fifth light-emitting element, a light-emission state of the sixth light-emitting element, a light-emission state of the seventh light-emitting element, a light-emission state of the eighth light-emitting element, a light-emission state of the ninth light-emitting element, a light-emission state of the tenth light-emitting element, and a light-emission state of the eleventh light-emitting element.

17. The display device according to claim 16, wherein the circuit unit calculates a current degradation amount D (x, y, t) of the first light-emitting element, using Equation 4 below, in Equation 4, F{G (x, y)} is the degradation amount of the first light-emitting element when influence of a subpixel adjacent to the first subpixel is not factored in, each of α1 to α10 is a weighting coefficient based on a positional relationship between the first subpixel and a subpixel adjacent to the first subpixel, each of β1 to β10 is a degradation promotion coefficient indicating a degree of influence, on the first subpixel, derived from a light-emission state of a light-emitting element included in the subpixel adjacent to the first subpixel, the light-emission state is determined by a grayscale value or a glowing period of the subpixel adjacent to the first subpixel, α11 is a weighting coefficient based on a positional relationship between the first subpixel and the first light-emitting element included in the first subpixel, β7 is a degradation promotion coefficient indicating a degree of influence, on the first subpixel, derived from a light-emission state of the first light-emitting element included in the first subpixel, and α11β11 is either 0 or 1, and $$D(x, y, t) = \quad \text{(Equation 4)}$$
$$D(x, y, t-1) + \alpha 1\beta 1 F\{G(x, y)\} + \alpha 2\beta 2 F\{G(x, y)\} +$$
$$\alpha 3\beta 3 F\{G(x, y)\} + \alpha 4\beta 4 F\{G(x, y)\} + \alpha 5\beta 5 F\{G(x, y)\} +$$
$$\alpha 6\beta 6 F\{G(x, y)\} + \alpha 7\beta 7 F\{G(x, y)\} + \alpha 8\beta 8 F\{G(x, y)\} +$$
$$\alpha 9\beta 9 F\{G(x, y)\} + \alpha 10\beta 10 F\{G(x, y)\} + \alpha 11\beta 11 F\{G(x, y)\}.$$

18. The display device according to claim 16, wherein the circuit unit calculates a current degradation amount D (x, y, t) of the first light-emitting element, using Equation 6 below, in Equation 6, each of α1 to α10 is a weighting coefficient based on a positional relationship between the first subpixel and a subpixel adjacent to the first subpixel, each of β1 to β10 is a degradation promotion coefficient indicating a degree of influence, on the first subpixel, derived from a light-emission state of a light-emitting element included in the subpixel adjacent to the first subpixel, the light-emission state is determined by a grayscale value or a glowing period of the subpixel adjacent to the first subpixel, α11 is a weighting coefficient based on a positional relationship between the first subpixel and the first light-emitting element included in the first subpixel, β11 is a degradation promotion coefficient indicating a degree of influence, on the first subpixel, derived from a light-emission state of the first light-emitting element included in the first subpixel, and α11β11 is either 0 or 1, and $$D(x, y, t) = D(x, y, t-1) + \alpha 1\beta 1 + \alpha 2\beta 2 + \alpha 3\beta 3 + \alpha 4\beta 4 + \quad \text{(Equation 6)}$$
$$\alpha 5\beta 5 + \alpha 6\beta 6 + \alpha 7\beta 7 + \alpha 8\beta 8 + \alpha 9\beta 9 + \alpha 10\beta 10 + \alpha 11\beta 11.$$

* * * * *